US007706178B2

(12) United States Patent  (10) Patent No.: US 7,706,178 B2
Parkinson  (45) Date of Patent: Apr. 27, 2010

(54) PROGRAMMABLE MATRIX ARRAY WITH PHASE-CHANGE MATERIAL

(75) Inventor: Ward Parkinson, Boise, ID (US)

(73) Assignee: Ovonyx, Inc., Rochester Hills, MI (US)

( * ) Notice: Subject to any disclaimer, the term of this patent is extended or adjusted under 35 U.S.C. 154(b) by 183 days.

(21) Appl. No.: 12/069,092

(22) Filed: Feb. 6, 2008

(65) Prior Publication Data

US 2008/0211539 A1  Sep. 4, 2008

Related U.S. Application Data

(63) Continuation of application No. 11/012,571, filed on Dec. 15, 2004, now Pat. No. 7,365,355, which is a continuation-in-part of application No. 10/983,491, filed on Nov. 8, 2004, now abandoned.

(51) Int. Cl.
*G11C 11/00* (2006.01)
(52) U.S. Cl. ....................... 365/163; 365/148
(58) Field of Classification Search ................ 365/148, 365/158, 163, 171, 113
See application file for complete search history.

(56) References Cited

U.S. PATENT DOCUMENTS

| 6,678,189 | B2* | 1/2004 | Tran ........................... 365/171 |
| 6,987,688 | B2* | 1/2006 | Lowrey et al. .............. 365/148 |
| 7,365,355 | B2* | 4/2008 | Parkinson ................... 365/163 |
| 7,494,849 | B2* | 2/2009 | Oliva et al. ................. 438/129 |
| 7,499,315 | B2* | 3/2009 | Lowrey et al. .............. 365/163 |
| 2003/0081445 | A1* | 5/2003 | Van Brocklin et al. ...... 365/100 |
| 2003/0189200 | A1 | 10/2003 | Lee et al. |
| 2005/0173691 | A1 | 8/2005 | Lee et al. |
| 2006/0097240 | A1* | 5/2006 | Lowrey et al. ................. 257/5 |
| 2009/0034325 | A1* | 2/2009 | Lowrey et al. .............. 365/163 |

* cited by examiner

*Primary Examiner*—Gene N. Auduong
(74) *Attorney, Agent, or Firm*—Kevin L. Bray

(57) ABSTRACT

A phase-change material is proposed for coupling interconnect lines an electrically programmable matrix array. Leakage may be reduced by optionally placing a thin insulating breakdown layer between the phase change material and at least one of the lines. The matrix array may be used in a programmable logic device. The logic portions of the programmable logic device may be tri-stated.

41 Claims, 16 Drawing Sheets

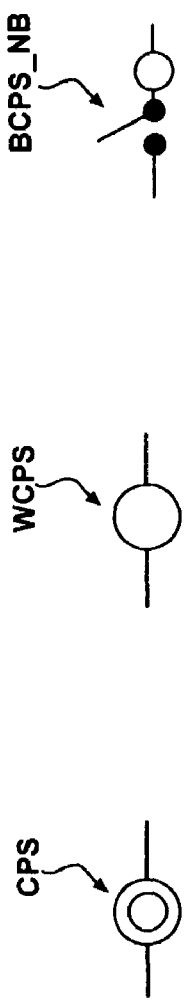
FIG - 11A  CPS
FIG - 11B  WCPS
FIG - 11C  BCPS_NB
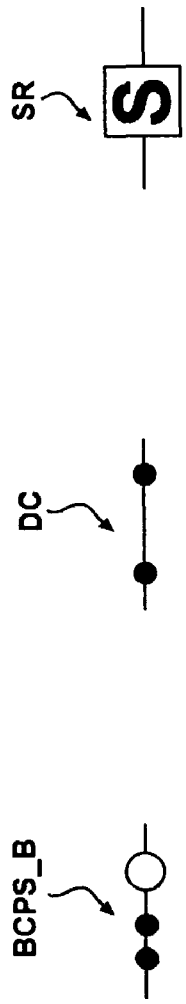
FIG - 11D  BCPS_B
FIG - 11E  DC
FIG - 11F  SR
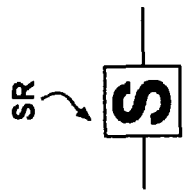
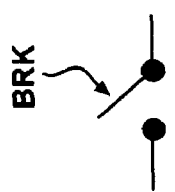
FIG - 11G  BRK

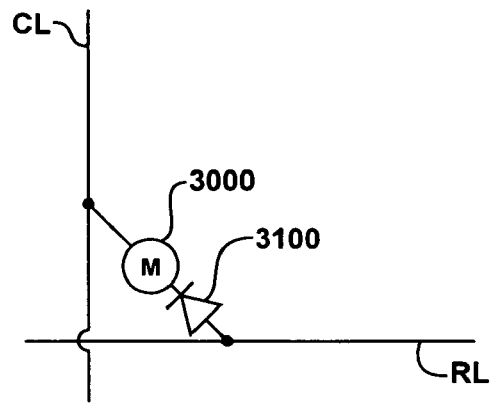
FIG - 13A
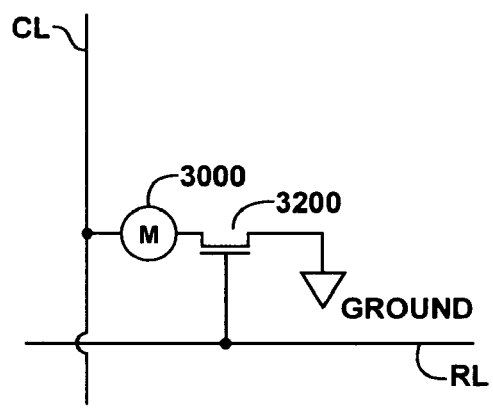 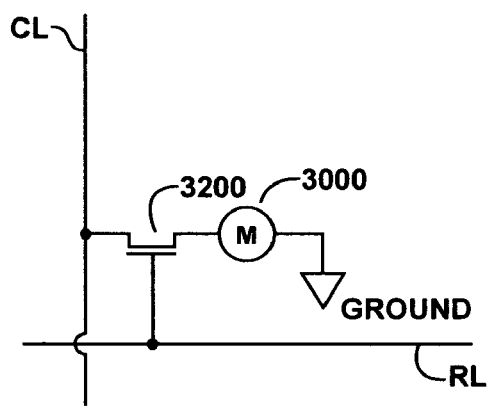
FIG - 13B FIG - 13C

PROGRAMMABLE MATRIX ARRAY WITH PHASE-CHANGE MATERIAL

RELATED APPLICATION INFORMATION

This application is a continuation of U.S. patent application Ser. No. 11/012,571 filed on Dec. 15, 2004 now U.S. Pat. No. 7,365,355 which is a continuation-in-part of U.S. patent application Ser. No. 10/983,491 filed Nov. 8, 2004 now abandoned and is hereby incorporated by reference herein.

FIELD OF THE INVENTION

The present invention generally relates to programmable integrated circuit devices, and more particularly to a programmable matrix array with programmable connections made with phase-change materials.

BACKGROUND OF THE INVENTION

Generally, phase-change materials are capable of being electrically programmed between a first structural state where the material is generally amorphous and a second structural state where the material is generally crystalline. The term "amorphous", as used herein, refers to a structural condition which is relatively less ordered or more disordered than a single crystal. The term "crystalline", as used herein, refers to a structural condition which is relatively more ordered than amorphous. The phase-change material exhibits different electrical characteristics depending upon its state. For instance, in its crystalline, more ordered state the material exhibits a lower electrical resistivity than in its amorphous, less ordered state. Each material phase can be conventionally associated with a corresponding logic value. For example, the lower resistance crystalline state may be associated with a logic "1" while the higher resistance amorphous state may be associated with a logic "0".

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$ (also referred to as GST225).

A volume of phase-change material can be reversibly programmed between a high resistance state referred to as a reset state and a low resistance state referred to as a set state to provide a binary mode of operation. A volume of phase-change material may also be programmed back and forth among three or more resistance states of intermediate resistance values to provide a multi-state mode of operation.

The phase-change materials may change states through application of an electrical signal. The electrical signal may be a voltage across or a current through the phase change material. The electrical signal may be in the form of one or more electrical pulses. For example, the volume of material may be programmed from its high resistance reset state to its low resistance set state through application of an electrical pulse (e.g. a current pulse) referred to as a set pulse. While not wishing to be bound by theory, it is believed that the set pulse is sufficient to change at least a portion of the volume of memory material from a less-ordered amorphous state to a more-ordered crystalline state. The volume of material may be programmed back from the low resistance set state to the high resistance reset state by application of an electrical pulse (e.g. a current pulse) referred to as a reset pulse. While not wishing to be bound by theory, it is believed that application of a reset pulse to the volume of material is sufficient to change at least a portion of the volume of memory material from a more-ordered crystalline state to a less-ordered amorphous state. It is conceivable that other forms of energy, such as optical energy, acoustical energy or thermal energy, may be used to change the state of the volume of material.

A phase-material material may be used to form a phase-change memory. Typically, a phase-change memory is arranged as an array of phase-change cells having rows and columns with associated word lines and bit lines, respectively. Each memory cell consists of a memory element which may be connected in series to an access device (also referred to as an isolation device). Examples of access devices include diodes, transistors and chalcogenide-based threshold switches. For use to connect logic it is possible that such access devices may be connected to the lines to be coupled (for example at the end of the lines). Each memory cell is coupled between the respective word line (also referred to as a row line or an X line) and the respective bit line (also referred to as a column line or a Y line).

The memory cells can be selected for a reading operation, for example, by applying suitable voltages to the respective word lines and suitable current or voltage pulses to the respective bit lines. A voltage reached at the bit line depends on the resistance of the storage element (which corresponds to logic value stored in the selected memory cell).

For general memory use, either commodity or embedded, the logic value stored in the memory cell may be evaluated by sense amplifiers of the memory. Typically, a sense amplifier includes a comparator receiving the bit line voltage (or a related voltage) and a suitable reference voltage. As an example, if the bit line driven by a read current achieves a voltage that is higher than the reference voltage for having higher resistance than the lower resistance case, the bit may be decreed to correspond to a stored logic value "0", whereas if the bit line voltage is smaller than the reference voltage for the cell having lower resistance, then the bit may be decreed to correspond to the stored logic value "1".

Products, such as programmable logic devices, achieve random logic designs by providing standard logic interconnected to user specifications through an X-Y grid. This X-Y grid is conceptually similar to the X-Y grid of a memory array and consists of X lines (corresponding, for example, to row or word lines) and a plurality of Y lines (corresponding, for example, to column or bit lines). The X lines typically cross (either over or under) the Y lines. The point at which an X line crosses (either over or under) a Y line may be referred to as a cross-over point or a cross-point.

Preferably, the X lines are oriented in a first direction while the Y lines are oriented in a second direction different from the first direction. The X lines may be substantially perpendicular to the Y lines. The X lines are typically physically spaced apart from the Y lines. The X lines are preferably insulated from the Y lines, however, it is possible that the X lines be connected to the Y lines such as through a shorting contact. When interconnecting logic instead of memory elements of a memory array, the X-Y grid may be more random in spacing and irregular in length than the X-Y grid of the memory array.

In a memory array, the impedance between the X lines and the Y lines is preferably very high, like an open circuit, until the select device (also referred to as an isolation device) is enabled, such as by row selection. Such selection may entail lowering or raising the X line. The isolation devices may be configured such that selecting a particular X line may lower the impedance between a memory element and a corresponding Y line, or between a memory element and a fixed voltage such as ground.

In contrast, the X-Y grid of conducting lines used for interconnecting logic (such as in a programmable logic array) may have a relatively linear resistance between the lines (instead of a piecewise linear resistance which may exist in a memory array). That is, for a logic device such as a programmable logic array, an OPEN connection between an X line and a Y line may be represented by a resistance which is relatively high where an actual open circuit is intended. Likewise, a CLOSED connection between an X line and a Y line may be represented by a resistance which is relatively low where an actual short circuit is intended.

The appropriate programmable connections between the X lines and Y lines at the cross-points may be programmed in different ways. One type of programming technology used to selectively determine connections is mask programming. This is done by the semiconductor manufacturer during the chip fabrication process. Examples of mask programmable devices include mask programmable gate arrays, mask programmable logic arrays and mask programmable ROMs. In the case of mask programming, a CLOSED connection may be an actual short circuit between an X line and a Y line at a cross-point while an OPEN connection may be an actual open circuit. This approach is characterized by good layout efficiency and performance, but higher tooling costs and time delay to first article product since custom masks and layout are used for each different customer product.

In contrast to mask programmable devices, field programmable devices are programmed after they are manufactured. Examples of field programmable devices include programmable ROM (PROM), electrically erasable ROM (EEPROM), field programmable logic arrays (FPLA), the programmable array logic device (PAL®), the complex programmable logic device (CPLD), and the field-programmable gate array (FPGA).

Field programmable devices make use of programmable connections at the cross-points of the X lines and the Y lines that can be programmed after the time of manufacture, and such programming may be done by the manufacturer to customer specification, or by the OEM upon receipt, or by the end customer in the field, and even updated periodically such as through an internet download. Such programmable connections may also be referred to as cross-point switches.

For field programmable devices such as field programmable logic arrays, the programmable connections may be made so that a relatively high resistance between the lines represents an OPEN connection between the lines while a relatively low resistance represents a CLOSED connection between the lines. Products with lower resistance for CLOSED connections may be faster with improved voltage margin, especially if the capacitance of the programmable connection tied to the interconnect lines is low. Programmable connections having a higher resistance for OPEN connections may have lower leakage and better voltage margin (those connections intended to be OPEN connections may have a larger voltage difference across the lines).

The power drained off by the cross-points intended to be OPEN is a larger problem in larger logic arrays with more X-Y interconnects, and hence more cross-points. Hence, for non-mask programmed field programmable devices, whether tying together logic or other electronic functions, there is a need for a programmable connection that can provide a relatively low resistance in CLOSED connections and a relatively high resistance in OPEN connections. Preferably, the programmable connection shall also add little capacitance to the interconnected conductive lines and change the wafer fabrication process as little as possible.

A programmable connection for a field programmable device (such as a field programmable logic array-FPLA) may be a volatile or non-volatile connection (the difference being whether the device needs to be re-programmed each time power is restored). For example, when a computer is turned off, the logic pattern desired in the field programmable logic chips may be stored in hard disc. Upon power-on restart, the logic interconnect pattern may be reloaded into the logic gates, at the expense of delayed restart. Such a volatile approach, may store the state of the programmable connection at each cross-point node on a static RAM (SRAM) driving an n-channel cross point transistor, as shown in FIG. 1.

FIG. 1 shows an example of a programmable connection that uses an SRAM to drive the gate of an n-channel transistor at the cross-point of an X line X1 and a Y line Y1. The p-channel pull-up transistors T2 and T4, provide a high logic level near the power supply, and the n-channel pull-down transistors T6 and T8, provide a pull-down to the lower power supply, in the usual CMOS fashion. Here, they are also cross coupled into an SRAM so that node N2 or node N4 may be high and the other low. Line PX may select the SRAM through transistor T12 so that data may be written on line PY (where the data may be furnished by a processor). Output node N2 drives the gate of transistor T10, making it conductive when the gate is high or non-conductive when the gate is driven (by programming the SRAM) to a low or off state. The transistor T10 is coupled between the Y conductive line and the X conductive line.

The programmable connection may be characterized by its worst case capacitance and resistance over the voltage and temperature range of the lines interconnected, a lower resistance when "on" providing less delay and better voltage margin. A higher resistance when "off" provides lower leakage and battery drain, as well as improved voltage margin by reducing line and driver voltage drop from leakage.

In the SRAM type programmable connection example shown in FIG. 1, the source to drain "on" resistance is lower for voltages on the coupled X and Y lines coupled that are less than the power supply to which the gate is driven, since the resistance from source to drain of the n-channel transistor tends to increase when the source or drain voltages approach the gate voltage. Accordingly, in some versions of greater complexity, the n-channel transistor T10 may have a special low threshold voltage Vt or may be in parallel with a p-channel with gate driven by node N4. This full mux approach provides lower resistance but at the expense of greater capacitance and increased chip area for each matrix switch.

As a further example, to make such an approach non-volatile, the SRAM in FIG. 1 may be replaced by an EPROM, EEPROM, or Flash transistor properly loaded to drive the n-channel transistor T10, or the SRAM may be mirrored with non-volatile memory such as FeRAM. Programming the non-volatile memory may be accomplished with a special higher voltage or current for the non-volatile element. However, such an approach increases process complexity.

Further, both the SRAM or the non-volatile alternative require considerable area in the base silicon to implement the switch, since the cross-point transistor alone may take up considerable area that could otherwise be dedicated to logic and interconnect. Further, considerable extra interconnect is necessary to X-Y select the SRAM or its non-volatile equivalent, such as PX and PY wires at each intersection to uniquely select the SRAM cross-point transistor driver or non-volatile programming element as shown in FIG. 1. Extra interconnect similarly may require extra chip area or interconnect layers that may raise cost and complexity of the delivered product.

The programmable connections in field programmable devices such as FPLAs may formed as non-volatile anti-fuses at the X-Y interconnect. Products using anti-fuses (for example FPLAs from Actel, Inc.), desirably reduce the chip area and layers dedicated to programming the programmable connection, by reducing the semiconductor active devices and interconnect (e.g. PX and PY) at each switch. This may also free up base silicon by putting the cross-point as a thin-film layer between interconnect layers. FIG. 2 shows an anti-fuse 10 coupled between an X line X1 and a Y line Y1. The anti-fuse 10 acts as an OPEN connection before it is programmed. The anti-fuse may be implemented using an insulative breakdown material that is broken down to provide a conductive pathway through application of a sufficiently high voltage across the material. The anti-fuse may be a metal-metal anti-fuse. Once programmed to a lower resistance state, an anti-fuse cannot be readily reversed. Accordingly, testing in the field may be difficult and reversing a programmed anti-fuse may not be possible.

Manufacturers of equipment may find an error in FPLA operation after programming at the factory and shipment to the customer that could be fixed if the programming is reversible, perhaps allowing correction through remote dial-up and download to re-program the logic if the cross-point programming is reversible. Or, the chip may be removed in the field and re-programmed by plugging into an adaptor to a computer.

However, while such an option is possible with SRAM or its non-volatile equivalent, such an option may not be possible with a fuse-based or anti-fuse based approach. Instead, the part may instead be removed and replaced at considerable expense to the manufacturer and inconvenience to the customer.

Further, due to the testing limitations of using irreversible links, testing of the arrays intended for use by the customer may be done only indirectly by programming spare but representative anti-fuses on a fuse or anti-fuse based interconnect approach before a part is shipped. However, actual programming of (untested) links used by the customer may be unsuccessful, since the links or cross-points actually used may be defective since they are untested before being shipped or used programmable connections found unprogrammable may require return of the unit to the factory or even replacement in the final equipment if personalization is done after assembly.

Each of these discards may be at successively higher cost and require an undesirable manufacturing and field use flow which is incompatible with a more preferred zero-defect manufacturing and use. To better improve "yield" and reduce defects in the field, the size and complexity of irreversible fuse or anti-fuse based approaches may be limited to relatively small arrays of interconnect compared to the more testable SRAM based approaches.

Further, the non-SRAM based approaches may add processing steps, beyond those of making the logic to be interconnected, that excessively raise cost. Customer preferences for lower cost suggest that such additional processing steps are preferably offset by reduced chip size, processing steps, and reduced test cost relative to SRAM, since SRAM may take up more chip area but does not add extra process steps.

Accordingly, there is a need for a testable field programmable matrix array using a non-volatile programmable connection that is reversible in the field.

SUMMARY OF THE INVENTION

One aspect of the present invention is a programmable connection comprising a programmable resistance material such as a phase-change material. Such a thin-film programmable connection may be located and fabricated between the intersection of the lines to be coupled by programming. Such a programmable connection may be programmed by the lines to be coupled, without additional programming lines located at or connected to the programmable connection. Instead, the programming control lines and programming devices may be located anywhere along the interconnect lines, and, for example, more conveniently and efficiently on the ends of the interconnectable lines. Thus the programming devices and lines are shared across more than one programmable connection to reduce programming overhead area for improved efficiency and cost.

The low resistance or set state of the phase-change material may be used where a CLOSED connection or short is desired between the layers of interconnect. The high resistance or reset state may be used where an OPEN connection is desired between the layers. Leakage through OPEN connections may be reduced by lowering the power supply relative to the threshold voltage Vth of the phase change material, or by raising Vth relative to the normal operating range of the power supply.

To further reduce power on unused cross-points, the programmable connection may further comprise a thin-film breakdown layer. The breakdown layer is preferably formed of a dielectric material. The breakdown layer may be disposed such that it is serially coupled with the phase-change material between the interconnected X and Y lines. In this case, the initial programming to a CLOSED connection entails not only setting the phase-change material to its low resistance state but also creating one or more conductive pathways through the breakdown layer by puncturing or breaking it down with voltage or current.

The programmable connection, preferably formed at a cross-point, may be tested by programming the phase-change material to the high resistance reset state and then to the low resistance set state. It is noted, that only those phase-change programmable connections which may potentially be CLOSED (initially or later) would need their breakdown layers penetrated at factory or at initial customer test. For example, if a customer knows that certain cross-points in a general purpose FPLA will probably not be used in certain applications, the breakdown layers of the corresponding programmable connections need not be penetrated. Since the breakdown layer causes the programmable connection to have higher impedance until penetrated, the leakage is thereby reduced while retaining general flexibility at each X-Y interconnection to program it later.

In sections of the design where lower resistance is desired at a cross-point, such as to drive the heavy capacitance load of a driver device input, several X-Y lines may be wired in parallel. Alternately, a small buffer gate may be permanently wired-in to drive the higher capacitance input. Permanently wired interconnects may also be used for other logic connections in order to reduce the number of programmable connections, thereby further reducing leakage as well as test requirements. Alternately, an SRAM programmable connection (or one or more other existing alternatives) may be wired in parallel with or used on the same chip with the phase-change programmable connections disclosed herein.

The breakdown layer may have an adequately high resistance so that no significant increase in leakage or battery drain occurs for those programmable connections having a breakdown layer that is not selected and penetrated.

Advantageously, the programmable connection may be made as a thin-film phase-change material and located between the interconnect conductive layers, preferably reducing chip size and/or freeing up more underlying chip area for logic while still being reversible for improved testability and field repair/changes. The thin-film programmable connection may comprise a phase-change material as well as a breakdown layer separating the material from one of the conductive layers. The breakdown layer is penetrated in those programmable connections which are actually programmed to a low resistance or tested to assure field programmability. With testability as described herein, a limitation against use of a thin-film programmable connection for larger logic arrays is overcome.

To further assist testability, an optional read current source may be used that includes, for example, an operational amplifier and a reference voltage VREF (as an input to the operational amplifier) to read and confirm the resulting resistance of a programmable connection after programming. (A re-write may be initiated if the results are not acceptable). Such reference voltage VREF may be adjusted to be a fixed value that is adjusted at probe to fit wafer characteristics, and may also be dynamically adjustable to be higher when reading a phase-change programmable connection programmed to the high resistance or reset state, and VREF may be adjusted lower, by on-chip electronic means, when reading a programmable connection programmed to the low resistance or set state (such adjustment to assure additional resistance margin beyond the resistance merely required).

Another aspect of the invention is an integrated circuit, comprising: a plurality of first conductive lines; a plurality of second conductive lines; and a plurality of programmable connections, each of the programmable connections coupled between one of the first conductive lines and one of the second conductive lines, each of the programmable connections comprising a phase-change material, wherein there is no active device coupled in series with the phase-change material between its corresponding first and second conductive lines. Active devices include transistors, diodes and threshold switches.

Another aspect of the invention is an integrated circuit, comprising: a plurality of first conductive lines; a plurality of second conductive lines; and a plurality of programmable connections programmably coupling the plurality of first conductive lines to the plurality of second conductive lines, at least one of the programmable connections comprising a phase-change material, wherein there is no active device coupled between the phase-change material and the plurality of first conductive lines or the plurality of second conductive lines.

Another aspect of the invention is an integrated circuit, comprising: a plurality of first conductive lines; a plurality of second conductive lines; and a plurality of programmable connections, each of the programmable connections programmably coupling a corresponding one of the first conductive lines to a corresponding one of the second conductive lines, at least a certain one of the programmable connections comprises a phase-change material, wherein there is no active device coupled between the phase-change material and its corresponding first or second conductive lines.

Another aspect of the invention is an electronic system, comprising: a first conductive line; a second conductive line; and a programmable connection coupled between the first conductive line and the second conductive line, the programmable connection comprising a phase-change material, wherein there is no active device in series with the phase-change material between the first and second conductive lines.

Another aspect of the invention is a programmable matrix array, comprising: a programmable element coupled between a row line and a column line, the programmable element comprising a phase-change material, wherein there is no active device coupled in series with the phase-change material between the row line and the column line.

Another aspect of the invention is a method of coupling a first conductive line to second conductive line, comprising: providing a phase-change material coupled between the first and second conductive lines, wherein there is no active device in series with the phase-change material between the first and second conductive lines; and programming the phase-change material between a first resistance state and a second resistance state. In one embodiment, at least one of the resistance states may be a state other than the reset state. Preferably, one of the states is the set state.

Another aspect of the invention is an integrated circuit, comprising: a plurality of first conductive lines oriented in a first direction; a plurality of second conductive lines oriented in a second direction different from the first direction; and a programmable element comprising a first electrode, a second electrode and a phase-change material, the first and second electrodes for supplying an electrical signal to the phase-change material, the first electrode directed connected to one of the first conductive lines, the second electrode directed connected to one of the second conductive lines.

BRIEF DESCRIPTION OF THE DRAWINGS

FIG. 11A shows a symbol for a programmable connection that comprises a phase-change material;

FIG. 11B shows a symbol for a programmable connection that includes a phase-change material but does not include a breakdown layer;

FIG. 11C shows a symbol for a programmable connection that includes a phase-change material and a breakdown layer wherein the breakdown layer has not been broken down;

FIG. 11D shows a symbol for a programmable connection that includes a phase-change material and a breakdown layer wherein the breakdown layer has been broken down;

FIG. 11E shows a symbol for a direct connect or hard wired connection;

FIG. 11F shows a symbol for a programmable connection that is based on SRAM technology;

FIG. 11G shows a symbol for a programmable connection based on anti-fuse technology;

FIG. 13A shows how a diode may be used as an isolation device with a phase-change memory element;

FIG. 13B shows how a transistor may be used as an isolation device with a phase-change memory element; and FIG. 13C shows how a transistor may be used as an isolation device with a phase-change memory element.

DETAILED DESCRIPTION OF THE INVENTION

Figure 3A:
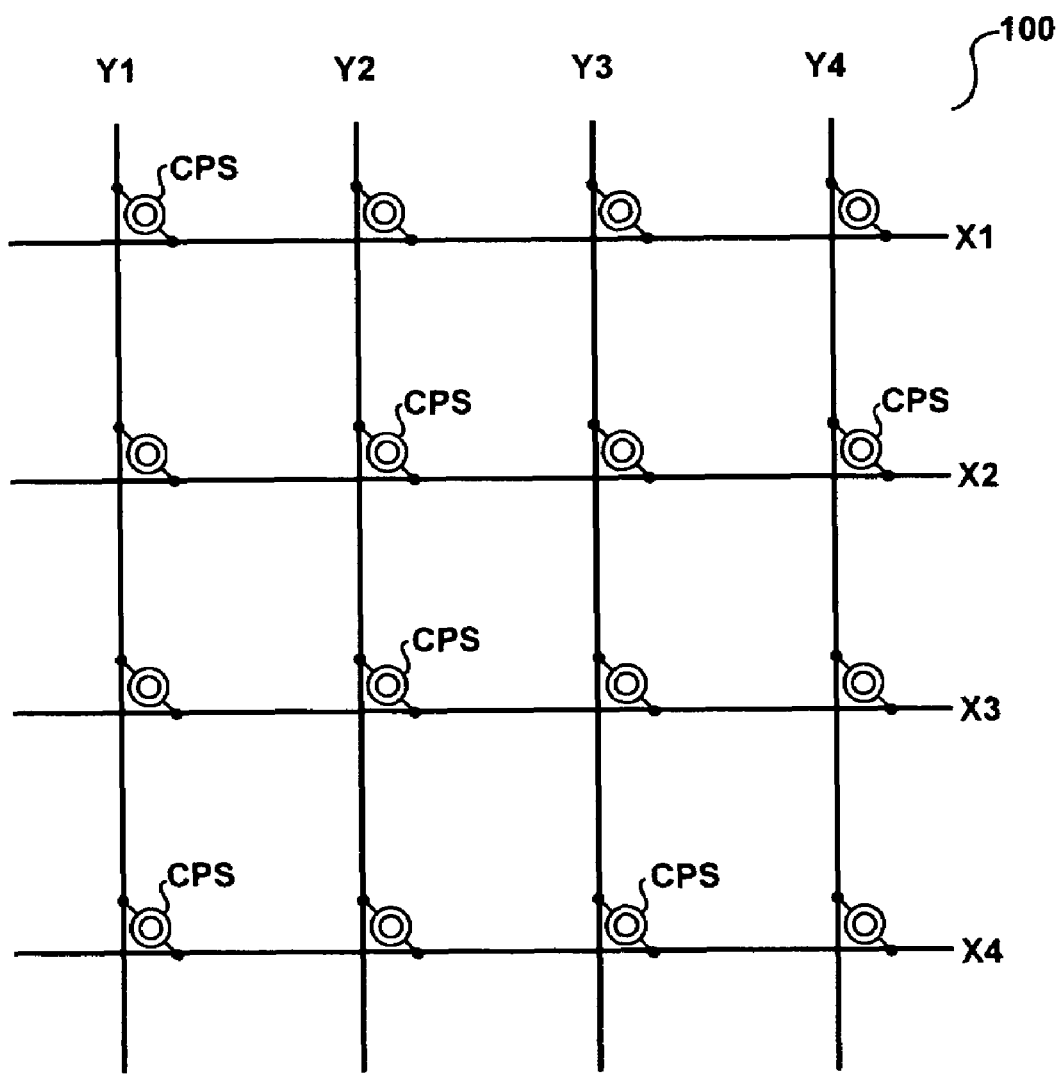
FIG. 3A is an embodiment of a programmable matrix array of the present invention using programmable connections comprising a phase-change material.

FIG. 3A shows an embodiment of an electrically programmable matrix array 100 of the present invention. The matrix array includes a first set of conductive lines X1 through X4 which are also referred to as X lines. The matrix array includes a second set of conductive lines Y1 through Y4 which are also referred to as Y lines. In the example shown there are four X lines and four Y lines. However, more generally, there may be one or more X lines, and there may be one or more Y lines. Preferably, there are a plurality of X lines. Preferably, there are a plurality of Y lines.

Each of the X lines preferably crosses (either over or under) each of the Y line at an angle. The angle may be substantially 90° (that is, substantially perpendicular). The points at which they cross over are referred to as the cross-over points or cross-points.

The embodiment of the matrix array 100 includes a plurality of programmable connections CPS. Each programmable connection CPS is coupled between an X line and a Y line. In the embodiment shown, it is seen how each programmable connection CPS is electrically coupled between a corresponding one of the X lines and a corresponding one of the Y lines. Furthermore, in the embodiment shown, it is seen that the each programmable connection CPS is electrically coupled to one of the X lines and one of the Y lines.

While, a programmable connection is coupled between a corresponding one of the X lines and a corresponding one of the Y lines, the programmable connection does not have to be physically disposed between the two corresponding lines. It may, for example, be electrically coupled to each of the lines without being physically located between the lines.

In the embodiment shown, each programmable connection CPS comprises a phase-change material. Generally, any phase-change material which is programmable between at least a first and second resistance state may be used. Preferably, the phase-change material may comprise at least one chalcogen element. An example of a phase-change material that may be used is $Ge_2Sb_2Te_5$. This alloy is also referred to as GST 225. GST 225 may be preferred since targets are readily available commercially and may be deposited by standard semiconductor equipment.

Other examples of phase-change materials which may be used are discussed in U.S. Pat. Nos. 5,166,758, 5,296,716, 5,341,328, 5,359,205, 5,406,509, 5,414,271, 5,534,711, 5,534,712, 5,536,947, 5,596,522, 5,825,046 and 6,087,674, all of which are hereby incorporated by reference herein.

As used herein, a programmable connection that includes a phase-change material may also be referred to as a phase-change programmable connection.

It is noted that other embodiments of the invention are possible where a programmable connection is formed from programmable resistance materials that can be electrically programmed between at least a first resistance state and a second resistance state, but which are not phase-change materials. Hence, it is possible that the programmable connection be made from programmable resistance materials other than phase-change materials.

Figure 4A:
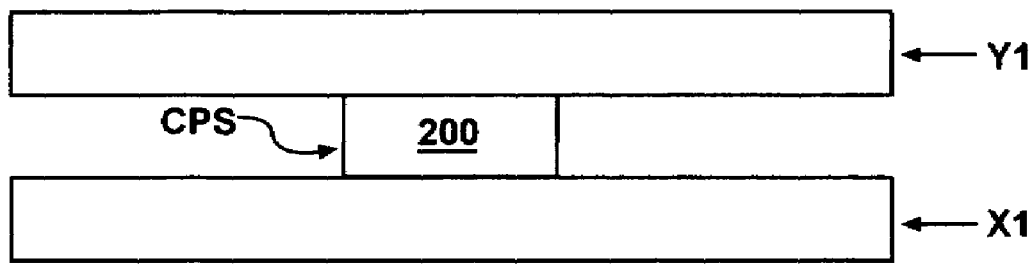
FIG. 4A shows an embodiment of a programmable connection of the present invention comprising a phase-change material.

The programmable connection CPS comprises a phase-change material. FIG. 4A shows a simplified diagram of an embodiment of a programmable connection CPS that consists essentially of a phase-change material 200. The phase-change material is electrically coupled between an X conductive line X1 and a Y conductive line Y1.

In the embodiment of FIG. 4A, the phase-change material is electrically coupled to both the X1 line and Y1 line. In the embodiment of FIG. 4A, the phase-change material is disposed between the X1 line and Y1 line. However, the phase-change material does not have to be physically disposed between the X1 line and the Y1 line. In this embodiment, the phase-change material is directly connected to both the X1 line and the Y1 line.

Figure 4B:
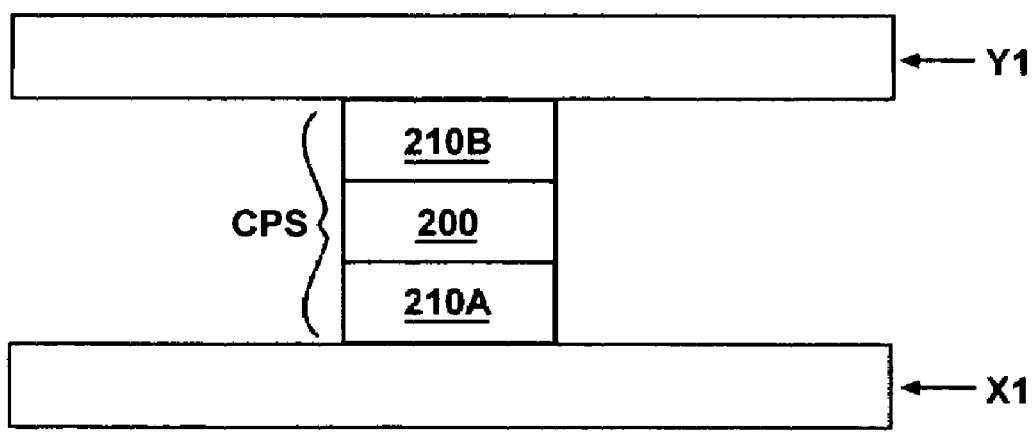
FIG. 4B shows an embodiment of a programmable connection of the present invention comprising a phase-change material and electrodes.

FIG. 4B shows a simplified diagram of another embodiment of a programmable connection CPS comprising a phase-change material electrically coupled between an X line X1 and a Y line Y1. In the embodiment shown in FIG. 4B, the phase-change material 200 is electrically coupled between the X1 line and Y1 line. In this embodiment, the phase-change material is coupled to the X1 line and to the Y1 line but is not directly connected to either. This embodiment further includes a first electrode (or contact layer) 210A electrically coupled between the phase-change material 200 and the X conductive line X1, and a second electrode 210B (or contact layer) electrically coupled between the phase-change material 200 and the Y conductive line Y1. In the embodiment shown in FIG. 4B, the phase-change material 200 is coupled to the X1 line through the electrode 210A. Likewise, the phase-change material is coupled to the Y1 line through the electrode 210B. In this particular embodiment, the first electrode 210A is directly connected to the X1 line while the second electrode 210B is directly connected to the Y1 line. (Other embodiments are possible where the electrodes are not directly connected to the X and Y lines).

In FIG. 4B, each of the electrodes 210A and 210B is shown as a single layer. However, each electrode may be formed as a plurality of layers. Also, each layer may have multiple sublayers. In addition, while two electrodes 210A and 210B are shown, it is possible that only a single electrode (either 210A or 210B) be used. In the embodiments shown in FIGS. 4A and 4B, the programmable connection CPS is electrically coupled to both the X conductive line and the Y conductive line.

Generally, the electrodes 210A and 210B may be formed of a conductive material. Examples of conductive materials which may be used include, but are not limited to, n-type doped polysilicon, p-type doped polysilicon, p-type doped silicon carbon alloys and/or compounds, titanium-tungsten, tungsten, tungsten silicide, molybdenum, titanium nitride, titanium carbon-nitride, titanium aluminum-nitride, titanium silicon-nitride, and carbon.

In the embodiment shown in FIGS. 4A and 4B the conductive lines X1 and Y1 preferably cross each other (in the embodiment shown, Y1 crosses over X1). Line Y1 is preferably oriented in a first direction while line X1 is preferably oriented in a second direction which is different from the first direction. Line Y1 and line X1 may be substantially perpendicular to each other.

In another embodiment of the invention, the phase-change programmable connection CPS may further include one or more breakdown layers. The breakdown layer is preferably a layer of a dielectric material. The breakdown layer is preferably electrically coupled between the phase-change material and one of the conductive lines X1 or Y1. An addition breakdown layer may be electrically coupled between the phase-change material and the other conductive line.

Embodiments of the invention shown in FIGS. 5A through 5F include a phase-change material 200 and a breakdown layer 300. In the embodiments shown in FIGS. 5A though 5F, the programmable connection CPS is electrically coupled between the X1 line and the Y1 line. In the embodiments shown in FIGS. 5A through 5F, the programmable connection CPS is electrically coupled to both the X conductive line X1 and the Y conductive line Y1. In the embodiments shown in FIGS. 5A through 5F, the programmable connection CPS is shown as being physically disposed between the X and Y lines. However, in other embodiments, this does not have to be the case.

Figure 5A:
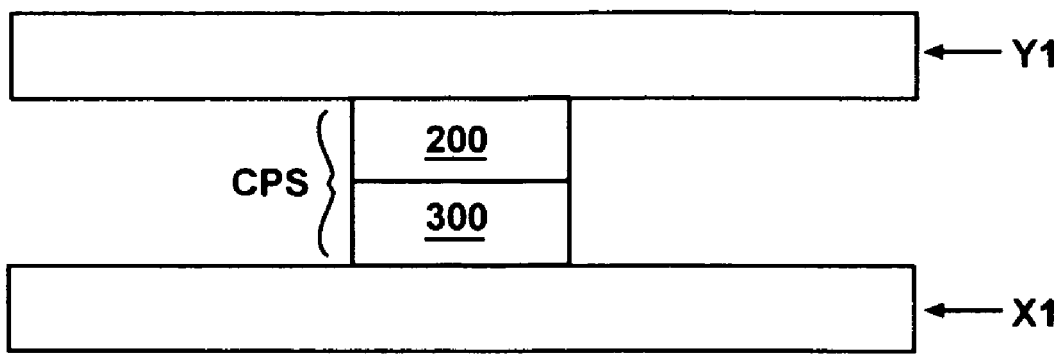
FIG. 5A shows an embodiment of a programmable connection of the present invention comprising a phase-change material and a breakdown layer.
Figure 5B:
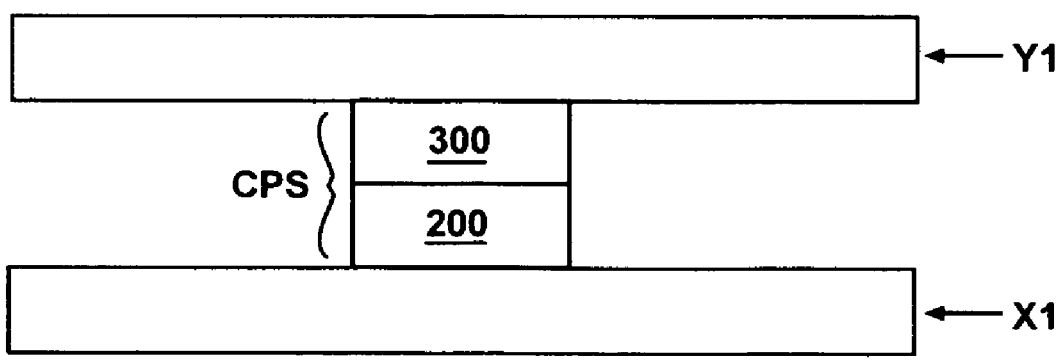
FIG. 5B shows an embodiment of a programmable connection of the present invention comprising a phase-change material and a breakdown layer.
Figure 5C:
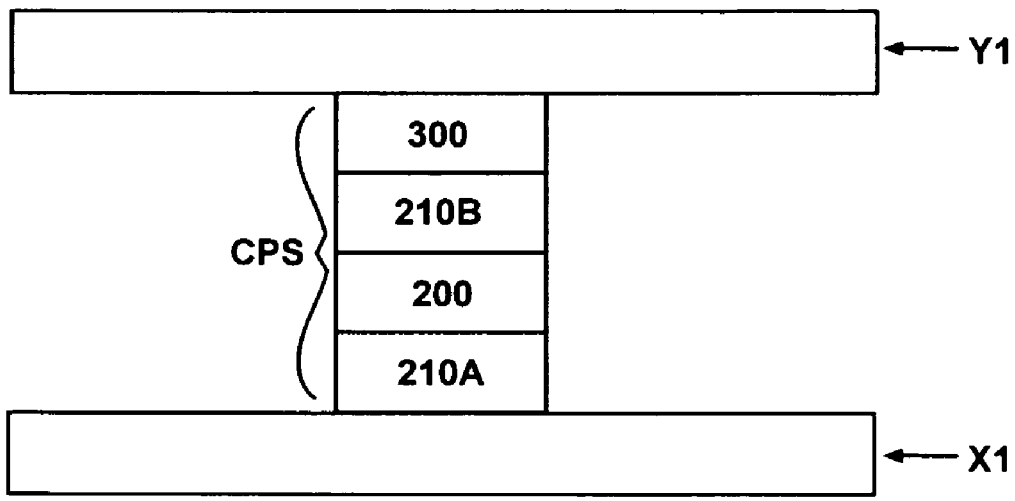
FIG. 5C shows an embodiment of a programmable connection of the present invention comprising a phase-change material, a breakdown layer and electrodes.
Figure 5D:
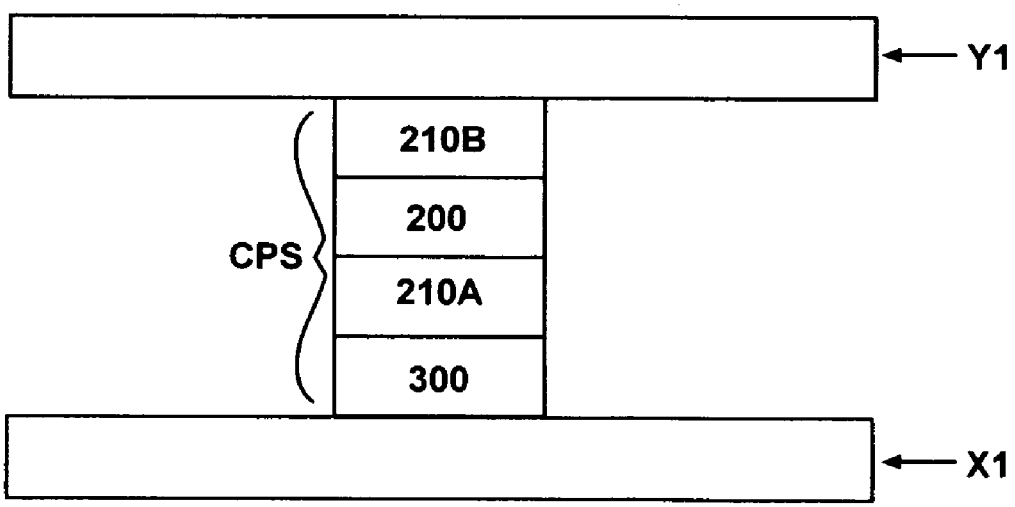
FIG. 5D shows an embodiment of a programmable connection of the present invention comprising a phase-change material, a breakdown layer and electrodes.

FIGS. 5A and 5B show a programmable connection CPS (without electrodes) coupled between an X conductive line and a Y conductive line. In FIG. 5A, the breakdown layer is electrically coupled between the X line X1 and the phase-change material 200. In FIG. 5B, the breakdown layer 300 is electrically coupled between the phase-change material 200 and the Y line Y1.

In the embodiments shown in FIGS. 5A and 5B, the phase-change material and the breakdown material are in electrical series with respect to the current path between the X1 line and the Y1 line. Hence, if the breakdown material is not broken down, the electrical resistance through the programmable connection CPS is high. If a voltage is applied across the X1 line and Y1 line, there is substantially no current flow between the X1 line and the Y1 line through the programmable connection CPS regardless of the state of the phase-change material 200. This condition may be characterized as an OPEN connection between the lines at the cross-over point (with substantially no communication between the lines).

After a sufficient voltage is placed across the breakdown layer 300, the breakdown layer may break down so as to create one or more conductive pathways through the breakdown layer. With the breakdown material broken down, if the phase-change material 200 is in its high resistance state then there will be lower resistance than before breaking down the breakdown layer but still relatively high resistance and substantially little current flow between the X1 line and the Y1 line if voltage is applied across the lines. The condition for this connection will still be OPEN (and substantially no communication between the lines). However, if the phase-change material is in its low resistance state, then the connection will be a CLOSED connection. There will be current flow between the X1 conductive line and Y1 conductive line (through the programmable connection) when a voltage is applied.

Figure 5E:
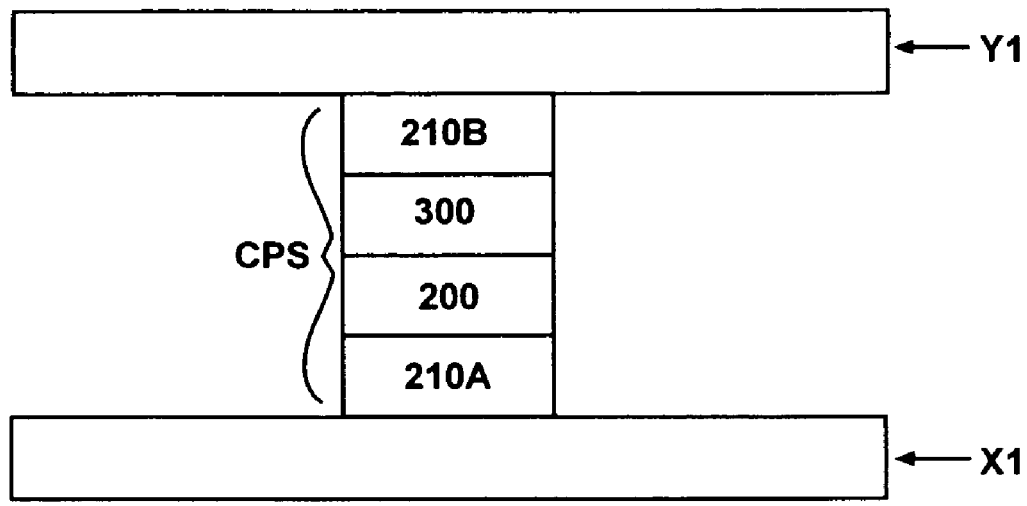
FIG. 5E shows an embodiment of a programmable connection of the present invention comprising a phase-change material, a breakdown layer and electrodes.
Figure 5F:
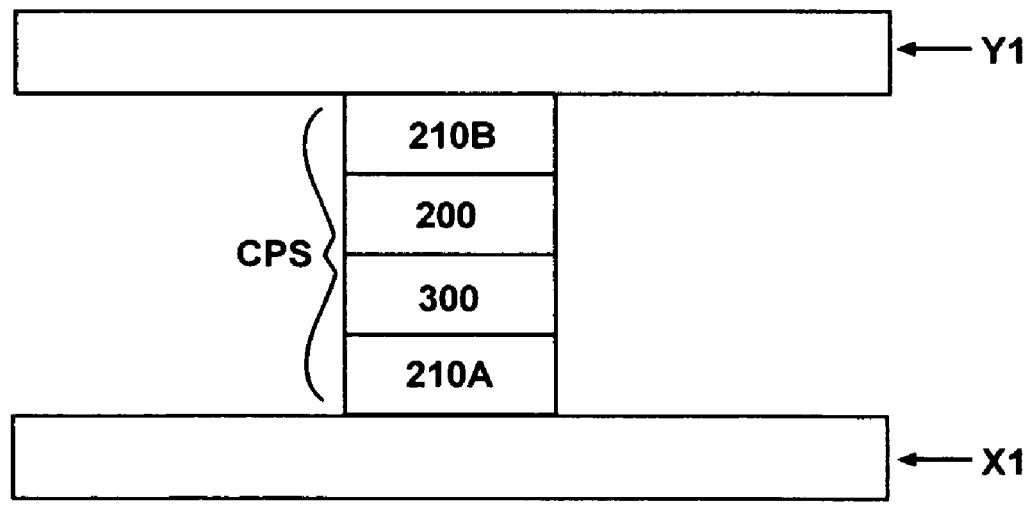
FIG. 5F shows an embodiment of a programmable connection of the present invention comprising a phase-change material, a breakdown layer and electrodes.

Referring to FIGS. 5C through 5F, it is seen that electrodes 210A and/or 210B may be added to the programmable connection CPS that also includes a breakdown layer 300. The electrodes may be formed as one or more layers of conductive material. In the embodiment shown in FIG. 5C, the breakdown layer 300 is between the top electrode 210B and the conductive line Y1; however, the breakdown layer may be placed between the electrode 210B and the phase-change material as shown in FIG. 5E. Likewise, referring to FIG. 5F, it is also possible that the breakdown layer 300 be placed between the electrode 210A and the phase-change material 200. It is noted that in FIGS. 5A though 5F, it is possible that in each of the cases shown an additional breakdown layer be included in series with the phase-change material, such as on an opposite side of the phase-change material. This additional breakdown layer may provide further insulation until the layers are broken down, and help assure the programmable connection CPS remains OPEN despite defects.

The breakdown layer may be any dielectric or insulative material known in the art. For example, the dielectric material may comprise any oxide, nitride, oxynitride or combination thereof. The dielectric material may be oxide of aluminum or an oxide of silicon. The dielectric may be a nitride of aluminum or a nitride of silicon. Examples include silicon nitride, $SiO_2$, $Si_3O_4$ and $Al_2O_3$. In one embodiment, the breakdown layer may be formed of a material comprising the elements silicon, nitrogen and hydrogen. In another embodiment, the breakdown layer may be formed of a material comprising, in atomic percent, between about 30-40% silicon, 40-50% nitrogen and up to 30% hydrogen.

In one embodiment, the breakdown layer has a thickness which is preferably less than 200 Angstroms, more preferably less than 100 Angstroms, and most preferably less than 60 Angstroms.

In another embodiment, the breakdown layer has a thickness which is preferably between about 10 Angstroms and about 200 Angstroms, more preferably between about 20. Angstroms and about 100 Angstroms and most preferably between about 40 Angstroms and about 60 Angstroms. In one embodiment, the breakdown layer may have a thickness of about 50 Angstroms. The thickness used may vary depending upon the selection of operating power supply range.

The material used for the breakdown layer as well as the thickness of the breakdown layer may be chosen so that the breakdown voltage across the breakdown layer is about 6 volts or less. The material for the breakdown layer as well as the thickness of the breakdown layer may be chosen so that the breakdown layer has a resistance of about 20,000 ohms or less after the breakdown layer is broken down.

The breakdown layer preferably has a high melting point and a low chemical reactivity. The resistivity of the breakdown layer may be between about $10^{12}$ to about $10^{17}$ ohm-cm. Silicon nitride may be preferred for improved integrity. $Al_2O_3$, for example, in the 20-40 Angstrom range, may be preferred for its higher melting point and reduced drift in device characteristics, such as reset current. Depending on whether done in-situ or the time between depositing the layers, dilute HF dip may desirably remove a native oxide. Such thickness and material may be engineered by those reasonably skilled in the art, depending on the breakdown voltage desired. Desirable variations in this layer material and adjacent electrodes for different applications will be apparent to one reasonably skilled in the art.

It is noted that in the examples shown in FIGS. 4A-4B and 5A-5F, the phase-change material is programmed by an electrical current that actually enters the phase-change material. It is conceivable that in an alternate embodiment of the invention, a programmable connection with a phase-change material is structured so that the programming current is used to heat the phase-change material through resistive heating in the electrodes without substantial power dissipation in the phase-change material.

In the embodiments shown in FIGS. 4A-4B and 5A-5F the X1 line is electrically coupled to the Y1 line through the programmable connection CPS. In the embodiments shown in FIGS. 4A-4B and 5A-5F, the phase-change programmable connection CPS programmably couples the X1 line to the Y1 line. The programmable connection CPS may be programmed to modify its electrical resistance and thus change the connective state between the X1 line and the Y1 line (for example, connective state may be programmed between an OPEN connection and a CLOSED connection).

An active device includes those solid-state electronic devices that are made up primarily of solid materials, usually semiconductors, which operate by the movement of charge carriers (e.g., electrons or holes) which undergo energy level changes within the material. Examples of active devices include diodes, transistors (such as MOS transistors and bipolar transistors) as well as threshold switches.

An active device such as a diode and a transistor may be fabricated in semiconductor material by addition of P or N material. Active devices such as diodes, transistors and threshold switches may be used as isolation devices in phase-change memory arrays.

FIG. 13A shows an example of the use of a diode 3100 as an isolation device with a phase-change memory element 3000. The diode 3100 is coupled in series with the phase-change memory element 3000 between the row line RL and the column line CL (and is in electrical series with the phase-change material within the memory element). Such diode may be replaced by a bipolar or MOS transistor, wired as a diode.

FIGS. 13B and 13C shows examples of using an NMOS transistor 3200 as an isolation device allowing selecting and accessing the memory element 3000 to determine the resistance. For this example, using an n-channel device, the RL line may be raised relative to the grounded source to access the memory element 3000 shown to read or write the memory element. Similarly, the transistor may be p-channel through connection of the gate to the negative voltage relative to source at, for example, the positive power supply.

Referring to the examples of the programmable connections shown in FIGS. 4A-4B and 5A-5F it is seen that there is no active isolation device (such as a diode, a transistor or a threshold switch) electrically coupled in series with the phase-change material 200 between the corresponding X line (shown as X1) and corresponding Y line (shown as Y1). In the embodiments of FIGS. 4A-4B and 5A-5F, there is no active device electrically coupled between the phase-change material 200 and either one (or both) of the corresponding X and Y lines (whether or not additional layers 210A, 210B or 300 are used). It is seen that the particular embodiments of the present invention shown in FIGS. 4A-4B and 5A-5F do not use an isolation diode as configured in FIG. 13A or an isolation transistor as configured in FIGS. 13B, 13C.

In certain embodiments of the present invention there are preferably no diodes coupled in series with the phase-change material between the X and Y conductive lines. In certain embodiments, there are preferably no diodes coupled between the phase-change material and either the X or Y conductive lines.

In certain embodiments of the present invention there are preferably no diodes and/or transistors coupled in series with the phase-change material between the X and Y conductive lines. In certain embodiments, there are preferably no diodes and/or transistors coupled between the phase-change material and the X and/or Y conductive lines.

In certain embodiments of the present invention there are preferably no diodes and/or transistors and/or threshold switches coupled in series with the phase-change material between the X and Y conductive lines. In certain embodiments, there are preferably no diodes and/or transistors and/or threshold switches coupled between the phase-change material and the X and/or Y conductive lines.

In certain embodiments of the present invention, there are preferably no active devices coupled in series with the phase-change material between the corresponding X and Y conductive lines. In certain embodiments of the present invention, there are preferably no active devices coupled between the programmable connection and the corresponding X and/or Y conductive lines. In certain embodiments of the present invention, there are preferably no active devices coupled between the phase-change material and the corresponding X and/or Y conductive lines.

It is believed that, without adding such active devices, the interconnect matrix may become simpler to build and operate. Without adding such active devices, the interconnect matrix becomes smaller and more efficient in area by eliminating extra control lines and storage elements.

Figure 10:
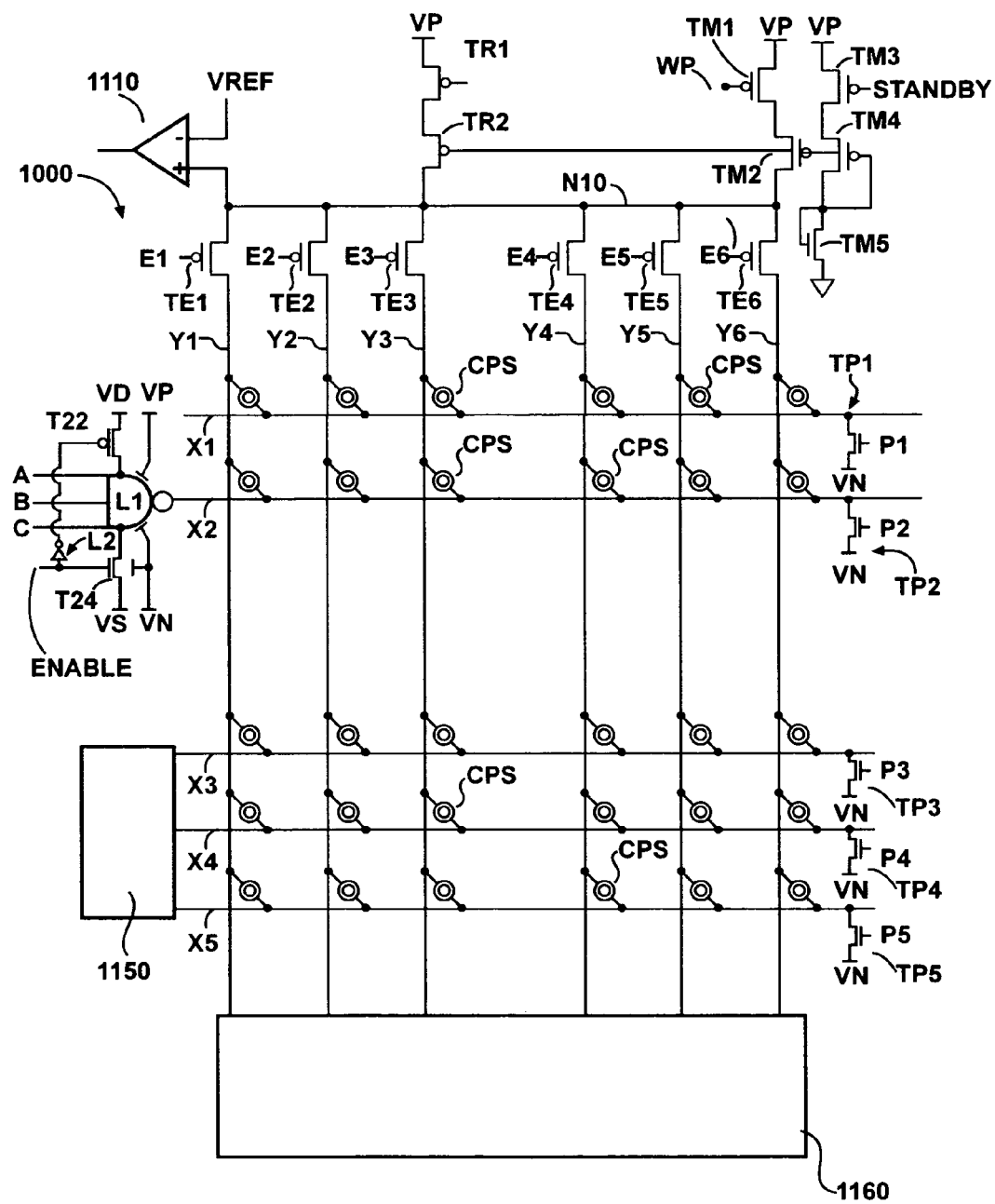
FIG. 10 is an embodiment of a programmable logic device using programmable connections comprising a phase-change material.

It is noted that active devices (used, for example, as selection devices) may be added elsewhere on the line to effect selection of the line for programming of the programmable connection at the intersection of another selected line. Selection devices to effect lines selection are shown in FIG. 10. FIG. 10 will be explained in more detail below.

In certain embodiments of the present invention it is possible that active devices may be used such as for level shifting with a diode or connection between the X and Y lines. Such alternate versions are shown in FIG. 14, where the operation is relatively the same as described herein if the Vcontrol line to the n-channel transistor 3200 is positive. However, the connection may be broken between CL and RL by either programming M element 3000 into the high resistance state or by lowering the Vcontrol line, such as to ground. Vcontrol may be driven by an SRAM cell or some other storage means.

As noted above, in one embodiment of the present invention, the phase-change programmable connection comprises a phase-change material and a breakdown material (with the phase-change material preferably in series with the breakdown material between the corresponding X and Y lines). In one embodiment of operating the phase-change programmable connection having both a phase-change material and a breakdown material, the volume of phase-change material is programmed between its high resistance state and its low resistance state after the breakdown layer is broken down to create a conductive pathway through the breakdown layer. The high resistance state corresponds to an OPEN connection while the low resistance state corresponds to a CLOSED connection.

As noted, a breakdown layer is broken down when an electrically conductive pathway is made though the breakdown layer. Such an electrically conductive pathway may be a small hole through the breakdown layer. Such a breakdown layer may be broken down and made conducting by applying a voltage greater than that usually seen between the conductive X-Y lines during normal use, using circuitry also used to program and reverse the programmable connection after the breakdown layer is penetrated and rendered conducting.

For example, a circuit (such as a programmable logic device) with programmable connections using a phase-change material as described herein may normally operate at 3V and program at greater than the threshold voltage Vth of the phase-change material (such as 4V). Then, the breakdown layer may be designed, for example, to permanently break down and become conducting between about 4V and about 5V. It is noted that when the breakdown layer is broken down or penetrated, an electrical pathway is created through the breakdown layer. This may be a small opening formed through the layer.

Hence, in one embodiment, a programmable connection may be formed so that it comprises a phase-change material but does not include a breakdown layer. In another embodiment, a programmable connection may be formed that includes a phase-change material as well as a breakdown layer. In addition, when a programmable connection is formed with a breakdown layer, it is possible that a) the breakdown layer is broken down or b) the breakdown layer is not broken down. To distinguish the embodiments and states of the programmable connections described herein, it is convenient to provide different labels. These labels are explained below:

Case 1: The programmable connection comprises a phase-change material:
  it is labeled as CPS Case 2: The programmable connection comprises a phase-change material but does not include a breakdown layer:
  it is labeled as WCPS Case 3: The programmable connection comprises a phase-change material and a breakdown layer:
  it is labeled as BCPS Case 3a: The programmable connection comprises a phase-change material and a breakdown layer. In addition, we wish to denote that the breakdown layer is broken down or popped to create a conductive pathway:
  it is labeled as BCPS_B Case 3b: The programmable connection comprises a phase-change material and a breakdown layer. In addition we wish to denote that the breakdown layer is not broken down but is instead intact:
  it is labeled as BCPS_NB FIGS. 11a through 11D show symbols that represent each of programmable connection states CPS, WCPS, BCPS_NB and BCPS_B, respectively. In addition, FIG. 11E shows a symbol for a direct connection DC, FIG. 11F shows a symbol for an SRAM-based programmable connection SR, and FIG. 11G shows a symbol for an anti-fuse/breakdown layer technology BRK.

Absent a breakdown layer (or multiple breakdown layers), the phase-change programmable connections may be in a low resistance state after wafer processing due to the high crystallizing temperatures. A full matrix of low resistance phase-change programmable connections may make initial programming more difficult until some of the programmable connections are reversed into a higher resistance state. To overcome this problem, a lower temperature wafer fabrication may be used so that the wafer finishes with the phase-change programmable connections relatively more amorphous and more resistive.

Figure 1:
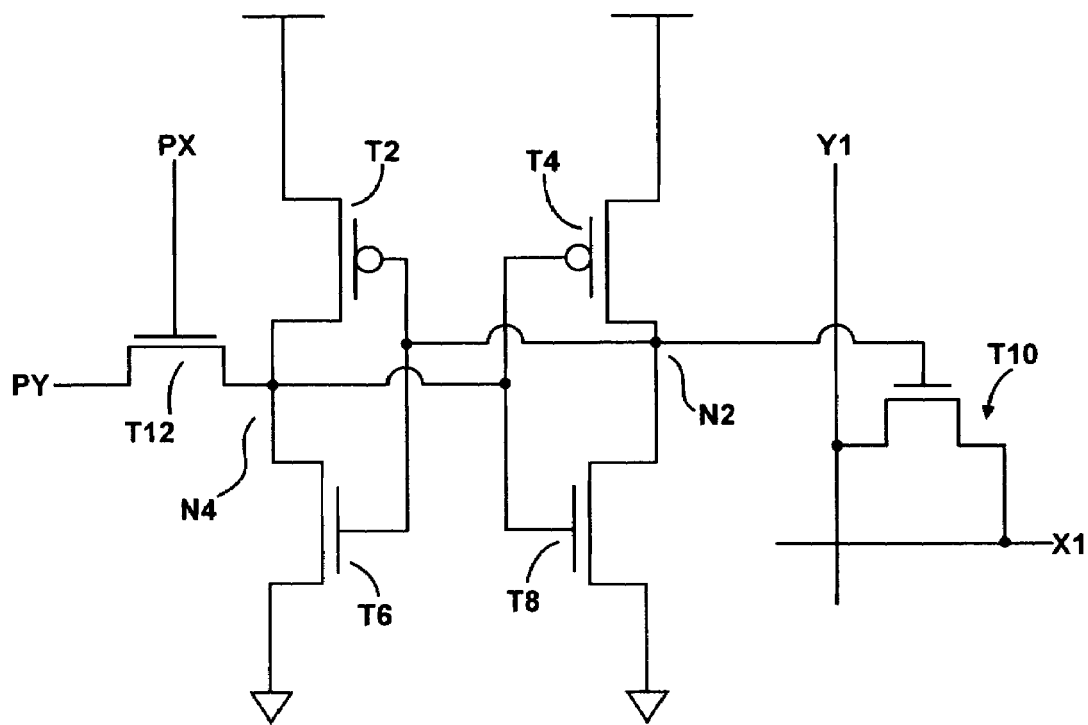
FIG. 1 shows an example of a volatile programmable connection using SRAM technology.
Figure 2:
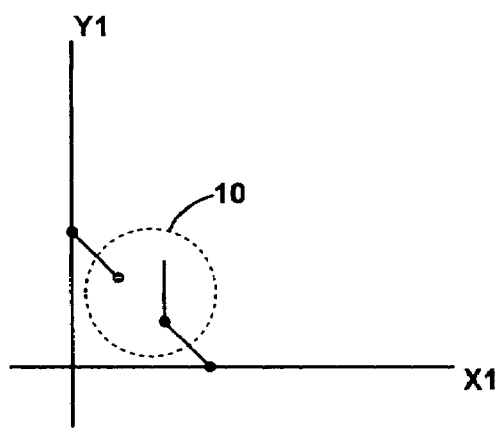
FIG. 2 shows a programmable connection using anti-fuse technology.
Figure 3B:
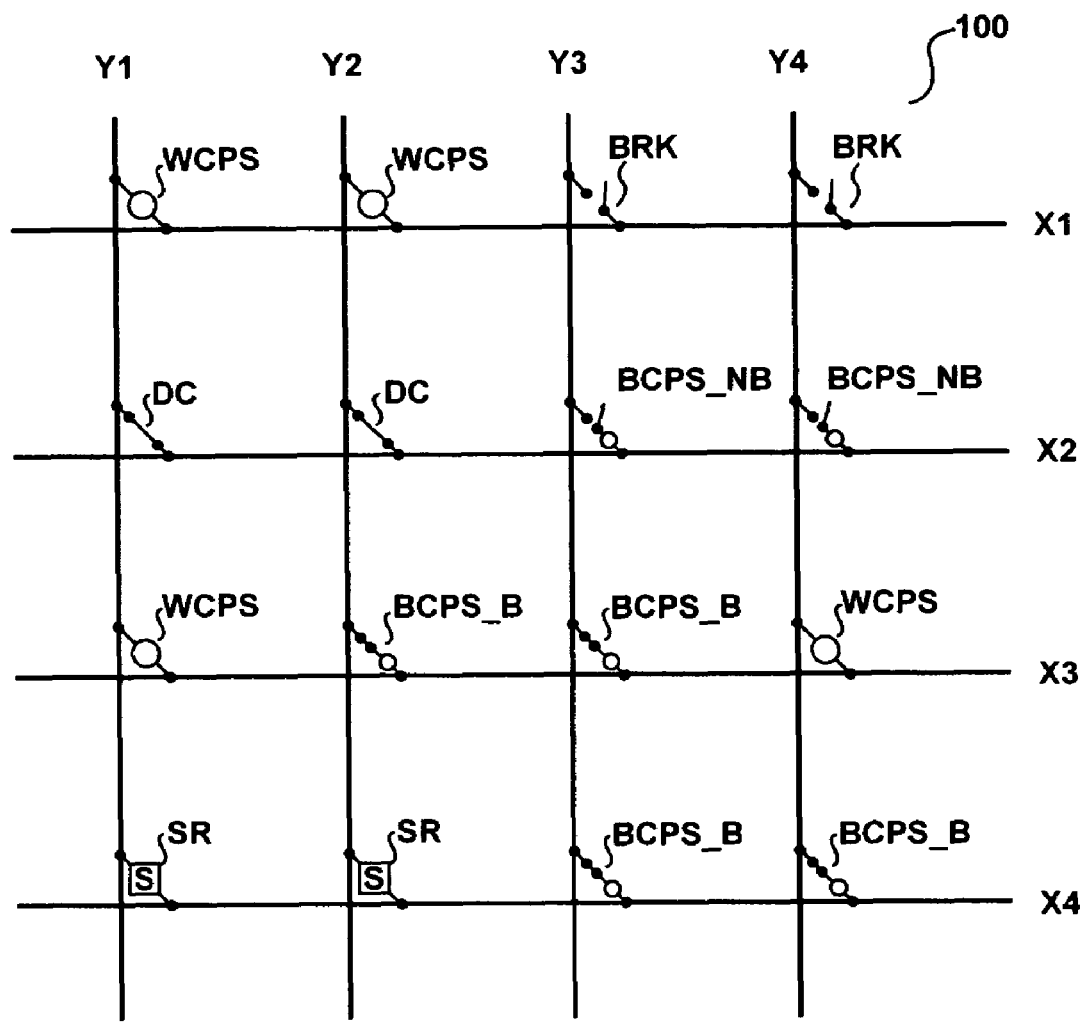
FIG. 3B is an embodiment of a programmable matrix array of the present invention using different types of programmable connections.

Some of the cross-points, such as for reasons of faster write speed or lower resistance to drive an output, may be hardwired or electrically coupled together through programmable connections such as the ones shown in FIGS. 1 and 2 (or the other variations thereof familiar to those reasonably skilled in the art). It is possible to use several different types of programmable connections together in a single integrated circuit or a single programmable matrix array. An example of a matrix array that uses different types of programmable connections in shown in FIG. 3B. FIG. 3B is discussed in more detail below.

If a substantial portion of the phase-change programmable connections are not needed for a particular application or market segment, these programmable connections may be fabricated with a breakdown layer and only those programmable connections that are potentially needed are broken down and tested at the factory to better assure both states are functional. Later, if needed in the field, those programmable connections that were not broken down at the factory may subsequently be broken down in the field and thus made conducting so the programmable connections may be programmed to the low resistance state or reprogrammed to whichever state is desired.

An extra rewrite may be done initially, either to a phase-change programmable connection without a breakdown layer (labeled WCPS) or to a phase-change programmable connection with a breakdown layer that has been broken down (labeled BCPS_B). Such extra write cycles may "season" the device and assure it is active and reversibly programmable.

To achieve the many applications possible with programmable logic, it may be preferable to use a variety of programmable connections. FIG. 3B shows an embodiment of a matrix array of the present invention showing that it is possible to use several different types of programmable connections in the same matrix and/or on the same integrated circuit chip. For example, FIG. 3B shows that programmable connections may include programmable connections WCPS that comprise a phase-change material but not a breakdown layer, programmable connections BCPS_B that comprise a phase-change material and a breakdown layer wherein the breakdown layer is broken down, programmable connections BCPS_NB that comprises a phase-change material and a breakdown layer wherein the breakdown layer is not broken down, programmable connection BRK using anti-fuse technology (and which may be implemented using a breakdown layer), programmable connections SR using SRAM or non-volatile technologies, and direct connections DC (which may be actual open circuits or shorted circuits).

As with gate arrays where the interconnect may be programmed to be an open or short for coupling selected lines through a customized mask, such as a contact mask, here also such mask programming may be used beneficially. For example, certain cross-points that will probably be programmed or tested may be mask programmed to eliminate the thin insulating breakdown layer using a contact so that selected programmable connections CPS may not be insulated by a breakdown layer. In this way, the device need not be broken down which may be an advantage in certain applications by eliminating the breakdown step and related testing. Also, this may avoid applying special conditions or voltages to do the breakdown.

For such contact mask programmable applications, the breakdown layer may be fabricated into all or part of the programmable connections, and thus may be available for use in all or part of the programmable connections. Then, the breakdown layer may be broken down my mask programming through, for example, use of a contact mask. Other ways to break the layer down while processing the wafers at intermediate steps will be through use of a laser to selectively break down the breakdown layer for selected cross-points.

Figure 6A:
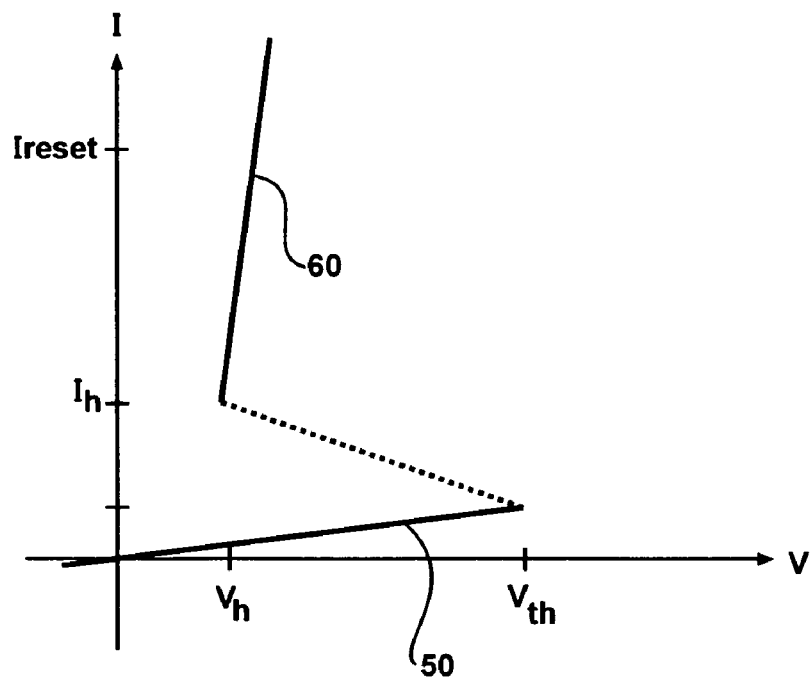
FIG. 6A is a current-voltage curve for a programmable connection comprising a phase-change material.
Figure 6B:
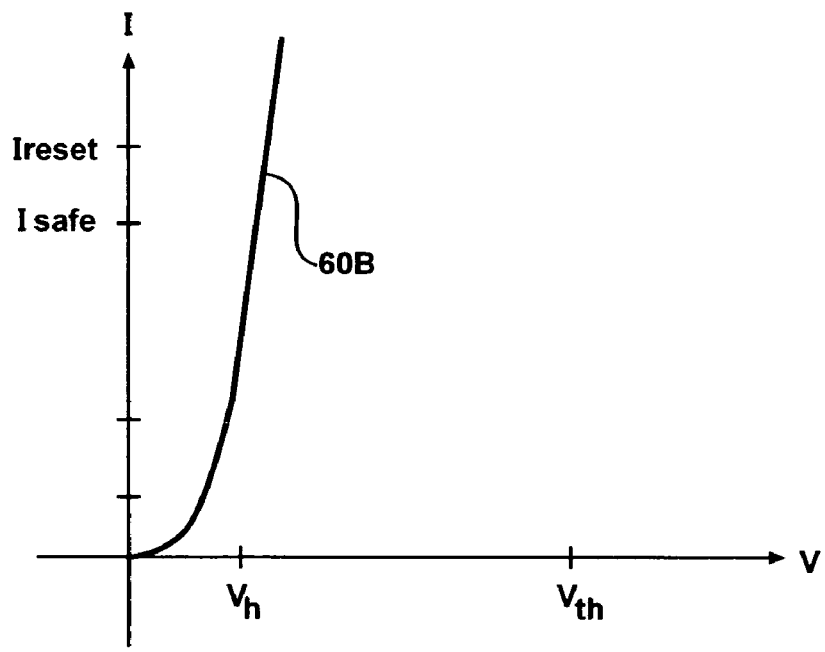
FIG. 6B is a current-voltage curve for a programmable connection comprising a phase-change material.

FIGS. 6A and 6B describe the current-voltage (I-V) characteristics of a programmable connection formed using a phase-change material and without a breakdown layer (or formed with a breakdown layer that has already been broken down). FIG. 6A shows a current-voltage (I-V) graph of a chalcogenide-based phase-change programmable connection corresponding to the high resistance or reset state. The graph includes a first branch 50 and a second branch 60. The first branch 50 corresponds to a higher resistance branch in which the current passing through the memory device increases only slightly with increasing voltage across the device. The second branch 60 corresponds to a dynamic lower resistance branch in which the current passing through the device increases significantly with increasing voltage.

When conditions are such that the current through the device and the voltage across the device is described by a point on the first branch 50, the device is in its high resistance or reset state. With no voltage across the device, the device remains in its high resistance state.

When the voltage across the device reaches or exceeds the threshold voltage Vth, the device switches from the first branch 50 to the second branch 60. On the second branch 60, the device becomes highly conductive. If a sufficient amount of energy is applied to the device, the device will program from its high resistance or reset state to its low resistance or set state. However, if the current is brought down below the holding current Ih before the device is programmed to another state then the device may return to the first branch 50 where it remains in the high resistance state (it is possible that repetitions like this may gradually result in a decline in the resistance of the high resistance state). The device will remain on the first branch 50 until another voltage having an amplitude greater than or equal to the threshold voltage Vth is applied, unless excessive temperatures are applied which may lower the resistance over time.

For an electronic circuit normally operating at 3V, the threshold voltage Vth may be around 4 volts while the values of the holding voltage Vh may be around 0.5 volts. In addition, the value of resistance of the first branch 50 may be around 200,000 ohms (corresponding the resistance of the high resistance state) while the value of dV/dI on the second branch 60 may be around 1000 ohms (corresponding to the resistance of the lower dynamic resistance state). These values may depend, for example, on the size of the contact to the phase-change material as well as the composition of the phase-change material. The I-V characteristic of the second branch 60 may be expressed analytically as Vh+dV/dI×current through the device. The holding voltage Vh is typically found by the imaginary straight line extension of the second branch 60 to the X axis.

To prevent accidentally programming the device from its high resistance state to its low resistance state, the voltage across the device is preferably limited to less than Vth at times other than when the device is being programmed. The threshold voltage Vth is dependent upon the thickness of the layer of phase-change material, hence the thickness may be adjusted so Vth is greater than the range of the operating power supply voltage (e.g. VD). For example, for at operating power supply voltage of about 2.7 to 3.3V, the threshold voltage Vth may be adjusted to about 4V or even higher.

As discussed, when the voltage across the phase-change programmable connection reaches or exceeds the threshold voltage Vth, the device switches from the first branch 50 to the second branch 60. After the device has switched to the second branch 60, if a sufficient energy is applied to the device, the device will program from the high resistance state to the low resistance state and the device will operate on branch 60B shown in FIG. 6B. In this case the device will remain on branch 60B shown in FIG. 6B until it is programmed back to its high resistance state (where it returns to an I-V characteristic like that in FIG. 6A).

FIG. 6B is an I-V curve showing a branch 60B which is similar to second branch 60 of FIG. 6A except that it extends, through voltages below Vh, to the origin. When the device has been programmed to its low resistance state it will operate on branch 60B of FIG. 6B. In fact, it will remain on branch 60B until it is programmed back to the high resistance state (no matter how low the current is through the device—even below the holding current Ih).

The resistance of the device in its low resistance state may be around 5000 ohms and may go even lower as the voltage drop across the device approaches and exceeds the holding voltage Vh (where the slope dV/dI along the curve 60B decreases towards, for example, 1000 ohms).

The device will remain in its low resistance state and will operate on the branch 60B until it is programmed back to its high resistance state. That may be done by applying a current pulse of a sufficient amplitude Ireset and for a sufficient time and preferably with a fast trailing edge, for example less than 10 nsec, that will program the device back to its high resistance state. Hence, when the device is operating in the low resistance state care must be taken to limit the current through the device to a level below Ireset unless it is actually desired to program the device back to the high resistance state. Preferably, to ensure against accidental programming, the current through the device is kept below a level Isafe which is preferably about 70% that of Ireset. Isafe may even be set to about 50% (or less) of Ireset to guard against noise and transients (preferably, the transient edge rate applied to any X or Y line coupled to the programmable connection device is slow enough so that the voltage drop across the device does not cause the current through the device to exceed the value of Isafe). Ireset may even be increased to improve margin by, for example, increasing the size of the contacts between the conducting layers and the phase-change material of the programmable connection.

For an interconnect where the load is primarily capacitance, the non-linear set resistance I-V curve (as shown in FIG. 6B) it may be helpful in avoiding excessive voltage drops across the cross-point line interconnect phase-change material, which may result in current exceeding Isafe. As the voltage drop increases, the resistance decreases so the loading capacitance is driven quicker and with less increase in voltage drop across the switch as the current increases.

Programming a programmable connection that includes a phase-change material may be done with a higher voltage than the normal range of the power supply, furnishing a current through the cross-point to be programmed. For example, in one embodiment, programming the phase-change device to the high resistance state may be accomplished with a current pulse having an amplitude of about 1.5 ma, a pulse width of about 10 nsec or greater and a trailing edge of less than about 10 nsec. Programming the phase-change device to the low resistance state may be accomplished with a lower voltage than that used to program to the high resistance state, forcing current on the order of about 1 ma. Such a programming scheme may be useful for programming a device having I-R characteristics similar to that shown in FIG. 7.

In some phase-change programmable connection designs programming to the low resistance state may be accomplished with a voltage that is even lower than the operating power supply voltage (unless the programmable connection includes a breakdown layer that has not been broken down or Vth is greater than the operating power supply voltage).

The current pulse used to program the device to its low resistance state preferably has a smaller amplitude and a greater width than that used to program the device to its high resistance state. For example, in one embodiment, the current pulse used to program the device to its low resistance state may have an amplitude of about 1 ma and a width of about 200 nsec (nanoseconds). As an alternative embodiment, a device may be programmed to its low resistance state by first applying a reset pulse and then programming the device to its low resistance state possibly by using a set pulse with a slow trailing edge (preferably greater than 200 nsec—such as 1 usec (microsecond)).

Figure 6C:
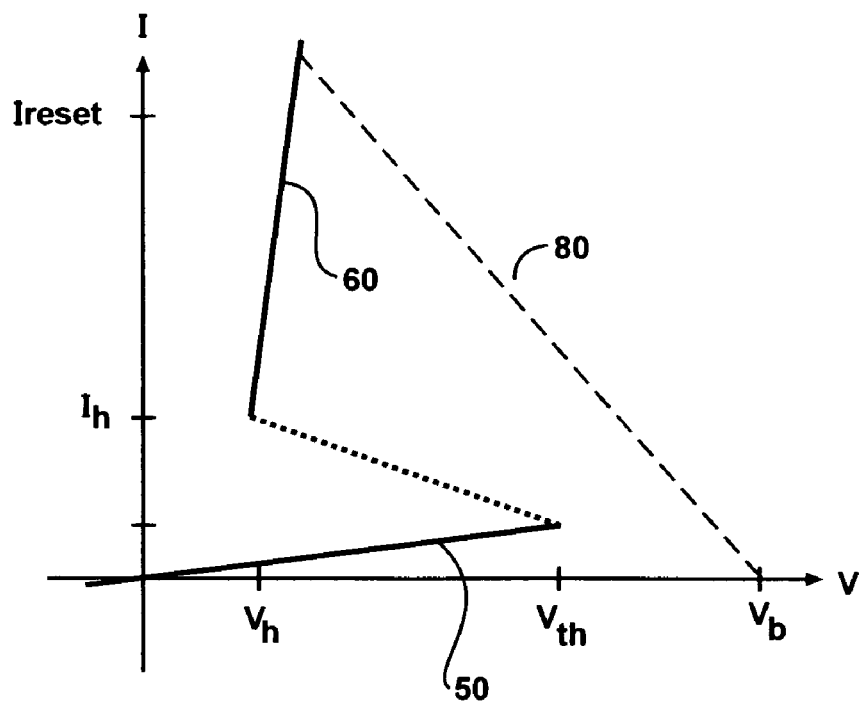
FIG. 6C is a current-voltage curve for a programmable connection comprising a phase-change material and a breakdown material.
Figure 6D:
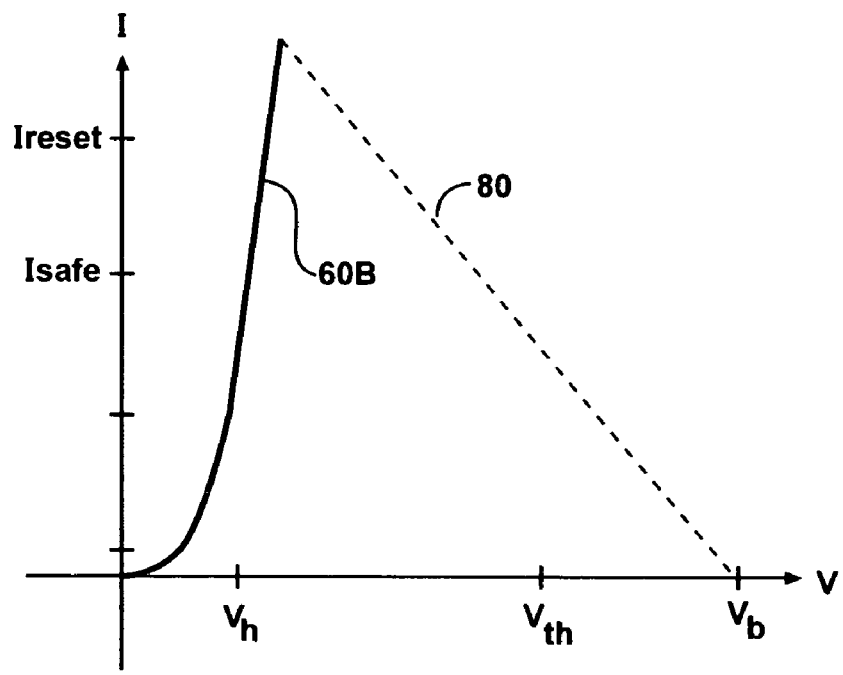
FIG. 6D is a current-voltage curve for a programmable connection comprising a phase-change material and a breakdown material.

The same techniques as described above may also be used to program a phase-change programmable connection that includes a breakdown layer. FIGS. 6C and 6D show current-voltage I-V curves for a programmable connection formed with a breakdown layer. The dashed line 80 represents that a device initially formed with a breakdown layer may be transformed into a device where the breakdown layer is broken down (which is like a WCPS device without a breakdown layer).

If the phase-change material is processed with a thin breakdown layer between the material and a conductor, the device has very high resistance to current flow as voltage is applied since the breakdown layer is preferably insulating. Hence, before the breakdown layer is broken down, the programmable connection provides an OPEN connection between an X line and Y line. The resistance of the programmable connection is high as increasing voltage is applied until the breakdown voltage Vb of the breakdown layer is exceeded. Vb is a voltage that may be about the same as Vth, or even greater than Vth to avoid loss of margin if the phase-change comes out of the factory in a relatively low resistance condition.

After the breakdown layer is broken down and rendered conductive, the BCPS device (with a breakdown layer), becomes like a WCPS device (without a breakdown layer) and returns to the dV/dI portion of the set or reset I-V curve. The state after stopping the breakdown current depends on the state programmed while on the dV/dI if Ireset was exceeded during the breakdown operation (otherwise device state may be determined by the heat and cooling rate during wafer processing). For example, after a breakdown operation with a high current of 2 ma, if the current is reduced with a trailing edge rate after breakdown that is slower than the edge rate that crystallizes, for example slower than 200 nsec for GST 225, the now WCPS-like device will be set. A peak current that is above Ireset may be reduced using a fast tailing edge, such as using a 10 nsec edge rate after breakdown, and the now WCPS-like device will instead be reset. Thereafter, unless the insulating layer were to regrow, the device will continue to remain and operate like an WCPS.

The solid line 60B in FIG. 6D is an I-V curve for a programmable connection BCPS after the breakdown layer has broken down and the device is programmed to its low resistance or set state (such as by coming out of the fab crystallized or by use of a lower current or slow trailing edge). After breakdown, the behavior of the device is like that of a device without a breakdown layer, so the device may be programmed with a current greater than Ireset and fast trailing edge to be like the solid line characteristics 50, 60 of FIG. 6C (similar to the first and second branches 50, 60 of FIG. 6A).

Figure 7:
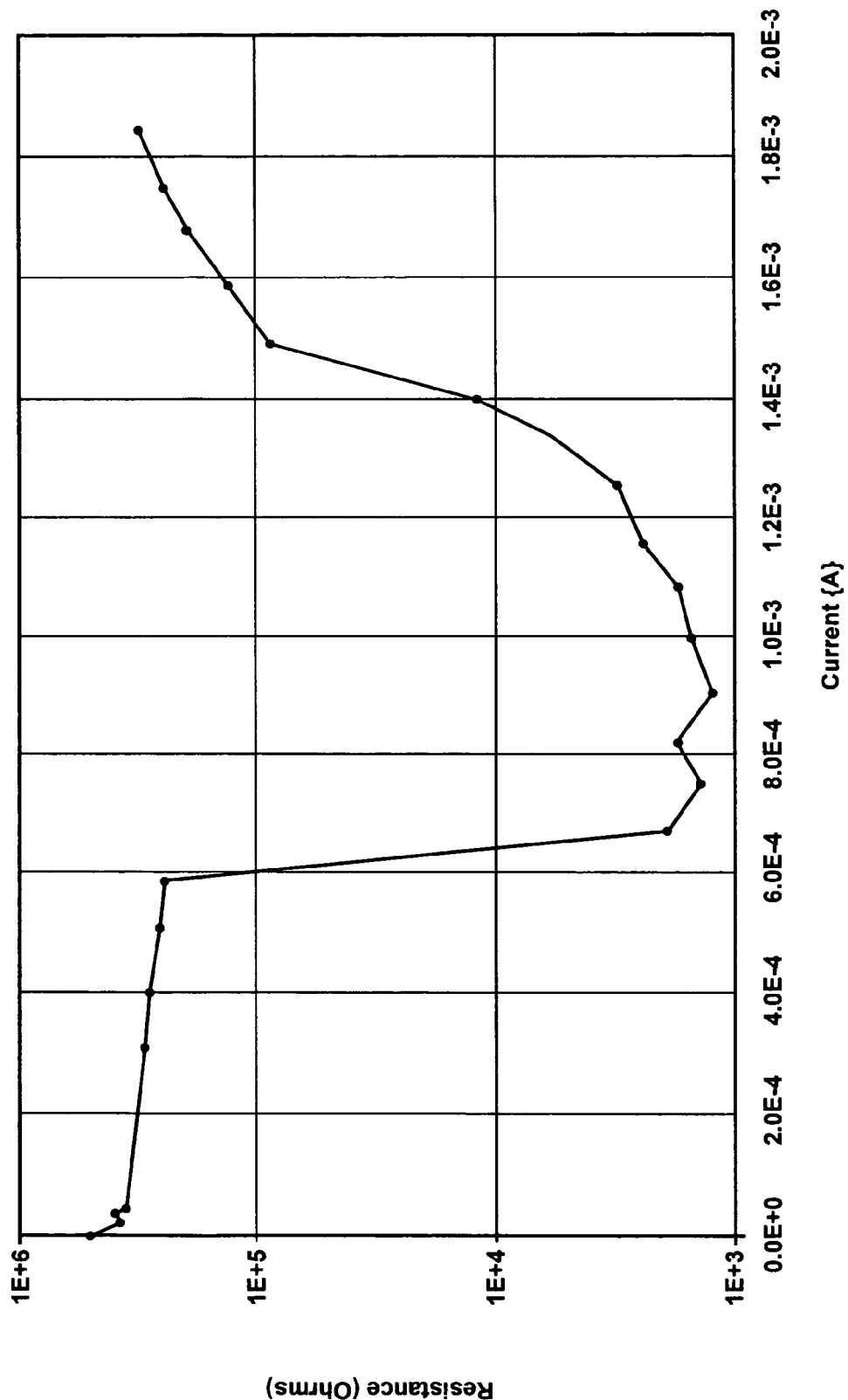
FIG. 7 is a current-resistance curve for a volume of phase-change material.

FIG. 7 provides an example of a current-resistance I-R curve of a programmable connection comprising a phase-change material showing the resistance of the device as a function of the amplitude of a current pulse applied through the device. The current pulses applied at each point on the curve may have a pulse width of about 250 nsec with a rising edge and a trailing edge each having a time of less than 10 nsec. The shape of the current pulses may be chosen so as to exceed both the required set and reset pulse widths to show the effect in resistance from varying the current amplitude alone. The current amplitude applied is shown on the X-axis while the resulting resistance measured after terminating the write pulse is shown on the Y-axis. Here, the resistance may be measured with about 0.2V across the device, a voltage chosen to be less than the holding voltage and thus reflecting more the set or reset resistance than the dV/dI resistance above Vh.

However, the range of current at which the programmable connection may be programmed to the low resistance or set state, here shown for example as about 0.5 ma to 1 ma, is prone to vary with contact opening size across the die and may drift with repeated write cycles. Hence, adequately centering the set pulse current amplitude within this optimum range may require feedback, perhaps a binary search method of programming at one current and then measuring the resulting resistance, as a programmable connection is programmed. Then, the set resistance may be measured and rewritten at an alternate write amplitude until a satisfactorily low set resistance is obtained. Similarly, a higher reset resistance may be programmed with feedback, using techniques familiar to those skilled in the art.

Alternatively, such feedback methods, with attendant requirements to read a bit after programming, may be minimized or avoided by programming the bit with the same current amplitude that exceeds that required for assured reset to a high resistance, choosing the resulting resistance to be high or low by respectively using a fast or slow trailing edge rate as the write pulse is terminated. For example, the Ireset at which the material switches to an adequately high resistance, such as 100,000 ohms, may be measured at the factory and found to be 1.6 ma, as shown in the example I-V curves. Using either the phase-change material or other alternatives such as laser fuses to avoid temperature effects such as from packaging or soldering, the programming current used may be adequately high, such as at 1.6 ma to assure adequate current to reliably program all the phase-change programmable connections on a given die to an adequately high resistance. For even more margin against subsequent drift or deterioration but with reduced write cycle endurance, the current used may be even higher, such as at 2 ma or greater.

This write current required may be measured at probe, and may be adjusted on chip to be adequately higher than the worst bit measured. This current may be further adjusted higher to provide adequate margin reflecting process characterization correlated to data retention and changes with operation, using techniques familiar to those skilled in the art. And the same current may be used to program both states using slow or fast trailing edge. For example, for a die where the max required Ireset required to program to adequately high resistance, viz. 200,000 ohms, is 1.6 ma, then 2 ma or even 3 ma may be used as to program both the set and reset states throughout the life cycle of the product for all phase-change programmable connections on that example chip with a worst-case characteristic like that in FIG. 7. Then, the bits may be confirmed by reading after writing and rewritten. Or, if field failure is experienced, the current may be dynamically adjusted by an on-chip write controller for further re-programming attempts using a higher write current amplitude.

Then, regardless of its prior state, a phase-change programmable connection may be written to a reset state resistance greater than, for example, 200,000 ohms by applying a 3 ma pulse for at least 20 nsec (to assure margin on the width) and with a fast trailing edge less than 10 nsec. To write the cross-point to a lower set state resistance such as, for example, to less than 10,000 ohms, regardless of its prior state, the same 3 ma amplitude and 20 nsec pulse width may be applied but with a slower trailing edge rate, for example a trailing edge rate greater than 200 nsec from peak to off. Alternately for faster speed of programming to set state, the trailing edge may fall slowly to at least less than half of Ireset, such as to 0.5 ma for the example device in FIG. 7, and fast thereafter to off current. Application of this set-slope technique may be better understood by reference to U.S. Pat. No. 6,487,113 which is hereby incorporated by reference herein.

In another embodiment of the present invention, it is possible that one or more of the phase-change programmable connections of a programmable matrix array may be formed from a phase-change memory element which is programmable between at least a first resistance state and a second resistance state. The phase-change memory element may be electrically coupled between an X line and a Y line. The memory element may be coupled between the X line and Y line without any additional breakdown layer between the X line and Y line as a WCPS programmable connection. Alternately, the programmable connection may be formed from a memory element coupled in series with a breakdown layer (so as to form a BCPS type device). One terminal of this device would be electrically coupled to the X line while the other would be electrically coupled to the Y line. Hence, the programmable connection (the programmable connection) may consist of the memory element alone or the memory element in series with the breakdown layer (where application of a sufficient voltage across the device would breakdown the breakdown insulating layer to become conductive).

The memory element may be made of a phase-change material (such as a $Ge_2Sb_2Te_5$ alloy). As noted above, the phase-change material can be reversibly switched between a generally amorphous, disordered phase and a generally crystalline, highly ordered phase. The two phases of the material exhibit different electrical characteristics; particularly, when the material is in the amorphous phase, it exhibits a relatively high resistivity, whereas when the material is in the crystalline phase, it has a low resistivity.

It is the material resistivity difference in the two phases that is exploited to store a high or low resistance value at the cross-point coupling the X and Y conductive lines. A high resistance state corresponds to an OPEN connective state while a low resistance state corresponds to a CLOSED connective state. While the programmable connection is preferably fabricated at the cross-point between the X and Y conductive lines it may also be connected in other ways to couple the lines.

Without entering into all particulars which are well known in the art, the phase of the phase-change material is stable below a predefined temperature (which may be around 150° C.) which is function of the choice of alloy for the phase-change material. The material phase can be changed by heating the material over such a temperature. For this purpose, a voltage (for example above about 1 volt) higher than a corresponding threshold voltage Vth(MEM) of the memory element (which may be less than 1 volt depending upon the design of the memory element) may be applied across the device. (Or, a current above the threshold current may be applied though the device).

The applied voltage causes a flow of a current through a resistive element (such as an electrode) and though the phase-change material. The resistive element, is preferably in close proximity to the phase-change material and acts as a local Joule-effect heater. It accordingly raises the temperature of the phase-change material. In other embodiments, it is possible to heat the phase-change material using a resistance element without having a current actually pass through the phase-change material.

Depending on the voltage applied, if the memory element is heated over a crystallization temperature (such as in the range of 300-450° C. depending on alloy composition) and then cooled down slowly, the phase-change material becomes crystalline. Conversely, if the memory element is heated over a higher, melting temperature (such as 600° C.) and then cooled down rapidly, the phase-change material becomes amorphous.

The resistance of the memory element can be detected by sensing the current flowing therethrough when a read voltage is applied, depending on the resistivity of the phase-change material and providing therefore an indication of the material phase, and an indication if the programming was adequate in developing the resistance state desired. Alternately, a current may be forced and voltage sensed that correlates to cell state, through the use of a reference voltage VREF and comparator as shown in FIG. 10. FIG. 10 will be explained in more detail below.

A voltage dropping across the memory element may be suitably lower than the threshold voltage of the memory element when the bit is amorphous, in order to prevent an undesired change of phase of the material that may occur for repeated reads or interconnect transitions if the threshold voltage of the memory element is repeatedly exceeded without re-writing (refreshing) the bit. When reading a crystalline bit, the current should be suitably lower than the current at which the bit is fully or partially changed to the amorphous state.

It is thus noted that an embodiment of the electrically programmable matrix array of the present invention may be useful, for example, as a memory device for the storage of data in addition to being useful for application to programmable logic devices (as explained below) and to other types of electronic devices benefiting from programmable or reconfigurable electrical pathways.

Figure 8:
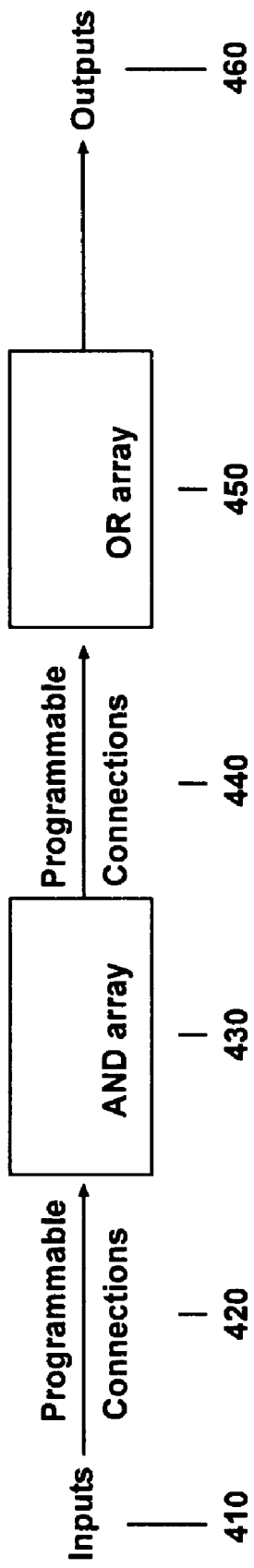
FIG. 8 is an example of a block diagram of a programmable logic array.

The programmable matrix array using programmable connections made with phase-change materials may be used for making programmable logic devices. One type of programmable logic device is a programmable logic array (PLA). A block diagram of a PLA is shown in FIG. 8. As shown in the block diagram, the PLA includes a set of inputs 410, a first set of programmable connections 420, an AND array 430, a second set of programmable connections 440, an OR array 450 and a set of outputs 460.

Figure 9:
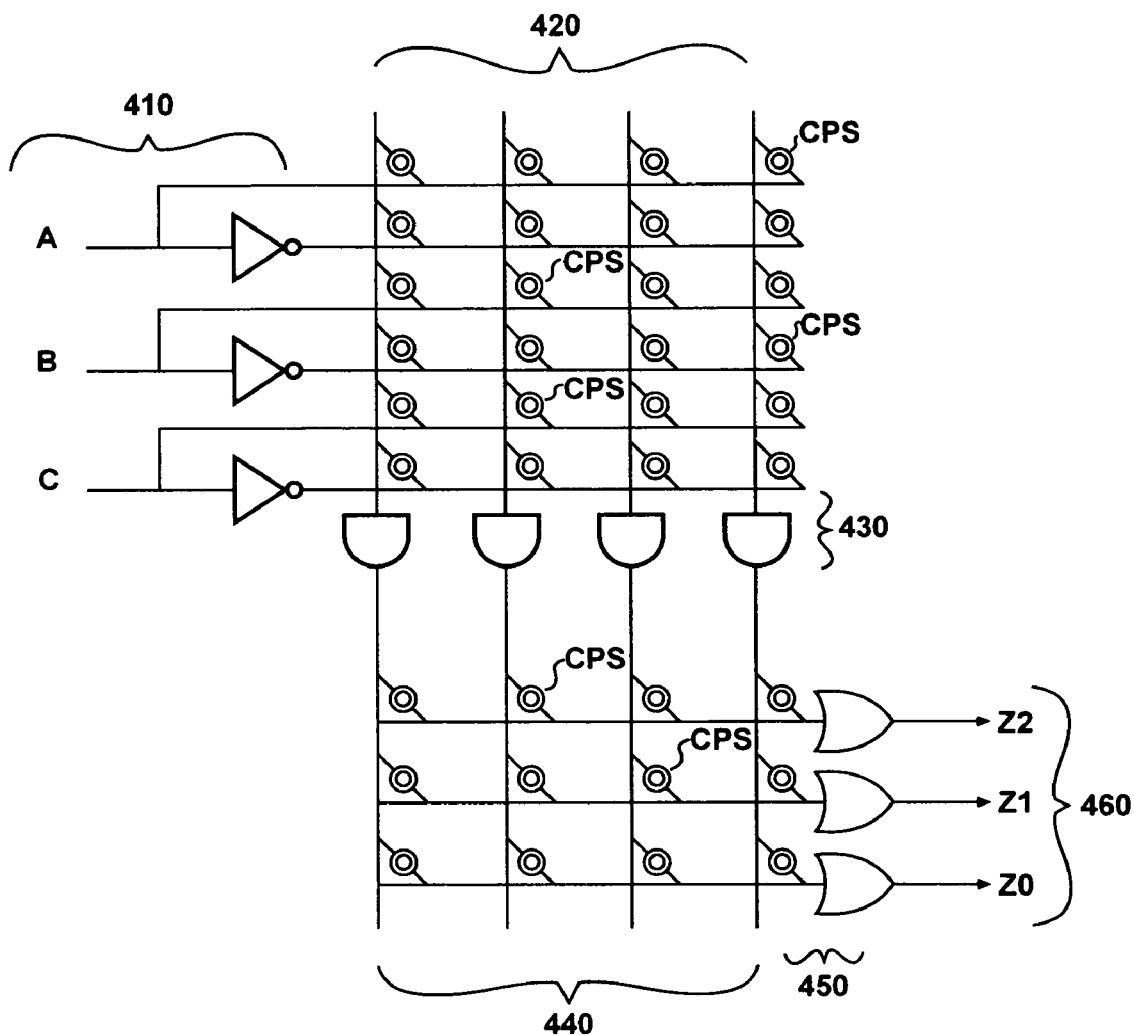
FIG. 9 is an implementation of the block diagram of FIG. 8 using programmable connections comprising a phase-change material.

FIG. 9 is an embodiment of a PLA which is an implementation of the block diagram from FIG. 8. FIG. 9 shows a PLA that includes a set of inputs 410 which includes inputs A, B and C, a first set of programmable connections 420, an AND array 430, a second set of programmable connections 440, an OR array 450 and a set of outputs 460 which includes outputs Z0, Z1 and Z2. The first and second set of programmable connections are formed using programmable connections CPS that comprise a phase-change material. The AND and OR gates shown for illustration may also have additional programmed or unprogrammed inputs, and may also have inverting outputs.

The electrically programmable matrix array using programmable connections comprising phase-change material may also be used to form a programmable logic device as shown in FIG. 10. FIG. 10 shows a programmable logic device 1000. The device 1000 includes a plurality of conductive interconnect X lines X1 through X5 and a plurality of conductive interconnect Y lines Y1 through Y6. As noted above, the actual number of X lines may be any integer greater than 0 (and is preferably an integer greater than 1). Likewise, the actual number Y lines may be any integer greater than 0 (and is preferably an integer greater than 1). A programmable connection CPS may be coupled between one or more of the X lines and one or more of the Y lines. As shown in FIG. 10, a programmable connection CPS is electrically coupled between an X conductive line and a Y conductive line. A programmable connection CPS is electrically coupled to an X line and to a Y line. While an example matrix is shown on the output of NAND gate L1, such a matrix may also be constructed for programmable input to NAND gate L1.

Further describing this embodiment shown in FIG. 10, the logic gate L1, shown here is a tri-state NAND gate for generality, since almost any logic system may be built from these gates. Variations using NOR gates, tri-state NOR gates, multiplexors, flip-flops, and analog circuits may also be formed. Such circuits may be similarly "open-circuited" from the power supply and interconnect lines by similar tri-state circuits or other means having equivalent effect.

The logic NAND gate L1 is shown to have three inputs A, B and C, however the number is not limited to any particular number. Transistor T22 is coupled between the power supply of NAND gate L1 (which is voltage VD) and NAND gate L1. Transistor T24 is coupled between gate L1 and voltage VS. Techniques may be extended to high-z the drive of an electronic function into the couplable lines. The input ENABLE is coupled to the gate of transistor T24. The input ENABLE is also coupled to the gate of transistor T22 though the INVERTER logic gate L2. Voltage VP is coupled to the p-channel well of logic gate L1 while voltage VN is coupled to the n-channel well of gate L1, if separate programming voltages are used, and otherwise kept at the operating power supply, which may be increased in magnitude for programming.

In the embodiment shown, the output of the NAND gate L1 is coupled to the conductive X line X2. Additional logic gates as well as input terminals may be coupled to any of the other X lines as well. Likewise, it is conceivable that one or more of the input terminal A, B or C may be coupled to one or more of the X lines without going through gate L1.

In the programmable device shown in FIG. 10, the logic NAND gate L1 is enabled for normal operation (and not programming) when the ENABLE input is high, allowing the logic gate L1 to drive it output node either to high or low, levels approximately equal to the power supplies VD or VS, with the logic output state depending on the inputs A, B, or C. The output of NAND gate L1 is driven actively low, for example, only if all the inputs A, B and C are high, and otherwise the output node is driven high. It is noted that while only three inputs A, B and C are shown, it is possible that there be more or less than three inputs.

The logic device 1000 also includes a number of auxiliary lines, useful for the operation thereof. In particular, the logic device 1000 is provided with a supply voltage line VD, distributing a supply voltage VD through a chip including to the logic device 1000. Depending on the specific application requirements, VD may be typically chosen to operate at some voltage, for example here at 3 V. An additional supply line VD may be furnished for programming programmable connections. A further supply voltage line (such as a ground voltage line GROUND, VS or VN) distributes the ground voltage or a negative voltage.

The voltage line VP provides a relatively higher programming voltage, generated by devices (e.g. charge-pump voltage boosters not shown in the drawing) integrated on the same chip, or externally supplied to the logic device 1000; for example, the high voltage VP may be at 3V for normal operation (connected through a pass transistor to VD), but at a higher voltage during programming, for example 5V. After programming, VP may be returned to be at a voltage equal to or greater than VD. Alternately, the user may simply increase VD for programming so that a separate VP is not generated on-chip or furnished from off-chip, and then all connections to VP shown in FIG. 10 could instead be made to VD.

In the embodiment shown in FIG. 10, each programmable connection CPS in the example matrix shown is coupled to a corresponding one of the X lines (X1 through X5) and a corresponding one of the Y lines (Y1 through Y6), though this is diagrammatic and the number, sequence or direction of the lines may be changed from that shown. In the embodiment shown in FIG. 10, each X line is coupled to more than one programmable connection CPS. Likewise, each Y line is coupled to more than one programmable connection. Additional "dummy" unused lines may surround the array, as well as alternate redundant repair lines for field repair alternatives should a selected cross-point not program.

Block 1150 represents additional circuitry coupled to the X-Y matrix such as input terminals and to logic gates. Block 1160 also represents additional circuitry coupled to the X-Y matrix such as output terminals and/or from logic gates.

Of course, it is possible that not all of the cross-points are coupled using a phase-change programmable connection. Some of the X-Y cross-points may simply be left in an OPEN connection. Also, some of the X-Y cross-points may be connected using mask programmable connections.

In particular, within each cross-point cell, a CPS cross-point element has a first terminal coupled to a corresponding X line and a second terminal-coupled to a corresponding Y line. The order of coupling the programmable connection to the lines may be reversed.

In one embodiment, the phase-change programmable connection CPS within the matrix is accessed by selecting the corresponding X line and Y line to which is it coupled. For example, for the device 1000 shown in FIG. 10, each X line X1 through X5 is respectively coupled to a select transistor TP1 through TP5 (each of which is also coupled to a voltage VN). The state of each transistor being controlled by gate inputs P1 through P5, respectively. Likewise, each Y line Y1 through Y6 is respectively coupled to a transistor TE1 through TE6 (each of which is also coupled to node N10). The state of each transistor is controlled by gate inputs E1 through E6, respectively.

For example, an X line X1 may be selected by turning on its respective select device TP1 using the select line P1 coupled to the gate of transistor TP1, such as by raising P1. Similarly, Y line Y1 may be selected by turning on TE1 through lowering the line E1 (coupled to the gate of TE1) to ground.

An X line selector circuit as well as a Y line selector circuit may me coupled to the logic device 1000. These circuits are preferably decoding circuits which operate to perform the selection of the X and Y lines to be coupled by a given programmable connection at a cross-point. The programmable connection CPS may be selected on the basis of an X address binary code such as XADD and a Y address binary code YADD, respectively, which are part of a cross-point address binary code ADD, for example received by the device 1000 from a device external to the memory (e.g., a microprocessor).

The X line selector circuit decodes the X address code XADD and select a corresponding one of the X lines X1 through X5. The Y line selector circuit decodes the Y address code YADD and select a corresponding Y line. More generally, both a pull-up (like that on the Y lines) and pull-down (like that on X lines) may both be provided on each Y line or each X line, or both. Programmable connection CPS may be programmed for forcing current only in direction, or may be programmed through forcing current in the other direction, or both directions.

The Y line selector circuit may be coupled to additional read/write circuits. The read/write circuits preferably include components which are normally required for writing the desired logic values into the selected programmable connections (if the logic gate output connected is not used), and may include circuitry for reading the logic values currently stored therein to verify programming if necessary. For example, the read/write circuits may include a timing logic circuit for use after receiving an ADD and write command, sense amplifier circuits together with comparator circuits if read verify required, reference current/voltage generators and current generators for reading and writing the logic values stored in the programmable connections such as current mirror(s) (like transistors TM3 and TM4) and current drivers (like transistors TM1 and TM2). As shown in FIG. 10, an input line STANDBY is coupled to the gate of TM3 to reduce power when not programming. These and other techniques may be used by one familiar in the art.

If square pulses are used for writing both set and reset, then two different sizes of write current drivers (or voltages) like TM2 may be provided, each with a select on/off switch like TM1. Voltage or current compliance to avoid over-voltage or over-current may be provided by adjusting VP and device sizes.

If trailing edge programming is used for better tolerance to changes in bit programming characteristics, only the one shown is needed, and the current may be set adequately high, such as at 2 ma to minimize or avoid the need to verify/rewrite. Then, the WP line (coupled to the gate of TM1) switches rapidly from low to high to turn off TM1, and hence the current in TM2 is quenched rapidly. If high capacitance on the node N10 (common to TE1 through TE(N)), a quench pull-down may be furnished to assist rapid pull-down internally to the X-Y matrix on the selected Y line Y1. Such pull-down may be on the common node to save area. After writing is complete with the current source off and voltage between the couplable lines quenched, VP may be lowered to equal VD and the input P1 (corresponding to the selected X line X1) is taken low. Then ENABLE line may be taken high to complete the cycle by enabling the logic.

Upon requesting the write cycle, the logic may be disabled, such as by taking tri-state input ENABLE low or by putting the gate output state to the voltage level suitable for writing (if necessary by raising VD or lower VS). Tri-stating the output by forcing it into hi-z condition, assures that a line to be coupled is not actively driven by a logic gate so that the write circuit may operate more directly on a selected cross-point without fighting the logic gate output, and may thus allow use of a current driver for writing or reading.

Alternately, in a larger array with more leakage, a voltage force approach may be used that assures adequate voltage across the selected cross-point to be written so write current exceeds Ireset, regardless of the parallel leakage also driven. Once the write cycle is complete, the tri-state may be re-enabled logic gate output or may be used for other functional purposes, if ENABLE is not made common to all gates for programming.

By such cross-point programming to a lower resistance, connections from the logic may be made to Y and X, and in turn to inputs to gates, as is familiar to those into the art.

To minimize standby current, only those phase-change programmable connection elements potentially needed for a given customer's type of circuit need be tested and available for programming. In the extreme, all programmable connections at each of the cross-point may be tested at the factory, meaning any breakdown devices are made conducting and cause leakage if not programmed to the low resistance state.

As a further alternative, an optional read circuit comprising transistors TR1 and TR2 may be utilized, that is enabled whenever TR1 is low and turns on the current mirrored into TR2. To check the programming of a bit with the logic tri-stated hi-z by lowering ENABLE, a read current is driven into the selected cross-point, as determined by the selected line E1 through E6 and the selected line P1 through P5. The resulting voltage can be compared using comparator 1110 (having a positive input terminal coupled to node N10 and a negative input terminal coupled to voltage VREF) to determine if the resistance is adequately low after programming (or adequately high if being reset). If not, the cross-point phase-change material may be reprogrammed or replaced with a redundant fuse or path if available. As part of this procedure, the programming current may be increased to assist programming a recalcitrant phase-change programmable connection.

By tri-stating the logic, any diversion of programming current into a logic gate output is minimized. Also, the voltage forced on a logic output may be increased above VD during program. To avoid diverting programming current from VP through the output diode to its well, any isolated wells may be tied respectively, to the more positive voltage for the p-channel well and to the more negative voltage for the n-channel well (or the well is simply grounded if a separate VN is not used).

VP may be at or above VD when VD is powered. VN may be left at ground in some applications where not needed to force adequate programming voltage and current. The tri-state devices T2 and T4, relative to the transistors used in L1, may have longer L (channel length) or utilize a thicker gate insulator to facilitate the relatively higher voltage seen during programming.

For a matrix in which a large number of cross-points are connected to a given couplable interconnect line, biasing of deselected lines during programming may be desirable. For example, deselected lines may be either floated (as shown), or may be hooked through a pass transistor of limiting resistance to an intermediate biasing voltage, such as VD during programming to further provide margin against incorrectly programming the wrong cross-point during programming.

The current or voltage forced during programming may be adjustable at the factory such as by paralleling additional transistor TM5 to increase the current in TM2 (as reflected by the mirror) or additional TM1 and TM2 may be paralleled and engaged by separate WP circuits, and such additional current and voltage programming options, among other helpful options familiar to those skilled in the art, may be implemented by algorithm and timing, both at the factory or in the field using an on or off-chip processor.

Since the driver devices only occur once along a line, the drivers may be oversized and deliver two or three times more current than required to better provide higher resistance resets. Similarly, extending the trailing edge to be much slower than minimum, such as by use of more than 1 usec for trailing edge slope from peak to 10% of peak, may better assure lower resistance sets for applications demanding higher performance through lower sets (for better delay) or higher resets (for more voltage margin and lower leakage). Using a slower trailing edge programming method with the same current as Ireset for both set and reset may degrade endurance but allows more variation in contact size and alloy content, and hence may contribute to better yield, especially for applications that specify programming endurance at less than Flash where the firmware is infrequently reloaded or changed.

It is noted that in one embodiment of operating the programmable connection, the programming of the phase-change programmable connection from a high resistance state to a low resistance state may use a slower trailing edge turn-off relative to the trailing edge turn-off edge rate for programming the programmable connection from its low resistance state to its high resistance state.

While providing a separate driver for each interconnect line allows optimizing the driver size and programming method, another embodiment may use an existing logic gate output driver to drive a line either low or high. In such applications, an extra (overriding) input may be provided to such logic gates as will be apparent to those familiar with the art. Accordingly, programming may be done with an adjusted power supply voltage where current is limited appropriately by the internal output driver resistance and dV/dI of the phase-change material, using a higher VP for reset and lower VP for set, the line to be (connected to the line driving by the logic gate output) still selected to the opposite power supply by the selection driver shown.

For larger gate count circuits or those with a large number of cross-points of interconnect lines, leakage may be reduced by biasing the circuit for normal operation at a lower voltage relative to the threshold voltage, Vth, of the phase-change material. For example, to minimize battery leakage, the operating voltage may be less than half Vth. Or, for further reduction, a standby mode may be provided wherein the operating voltage is reduced to be less than half Vth, or even zero.

The resistance of the reset phase-change memory is non-linear. Hence, leakage is further reduced even more than a proportionate reduction in power supply because cross-points biased at a lower voltage also have a relatively higher resistance. Since the cross-point is a more like a resistor than a transistor like current source, leakage is reduced by lowering voltage. Accumulated over many open cross-connects that are programmed to be OPEN, battery drain may be reduced by increasing resistance or lowering voltage. Alternately, leakage may be reduced by use of the breakdown layer and breaking down only those breakdown layers that will probably be normally programmed. Even untested, most if not all may still be field programmable if later needed.

Although the present invention has been described above with a certain degree of particularity with reference to preferred embodiments thereof, it should be understood that various changes in the form and details as well as other embodiments are possible. For example, the cross-point cells can be wired in parallel to reduce set resistance. Moreover, it will be apparent to those reasonably skilled in the art that the additional features providing further advantages are not essential for carrying out the invention, and may be omitted or replaced with different features more advantageous for a particular application. A person skilled in the art may apply to the solution described above many modifications and alterations all of which, however, are included within the scope of protection of the invention as defined by the claims herein.

Figure 12:
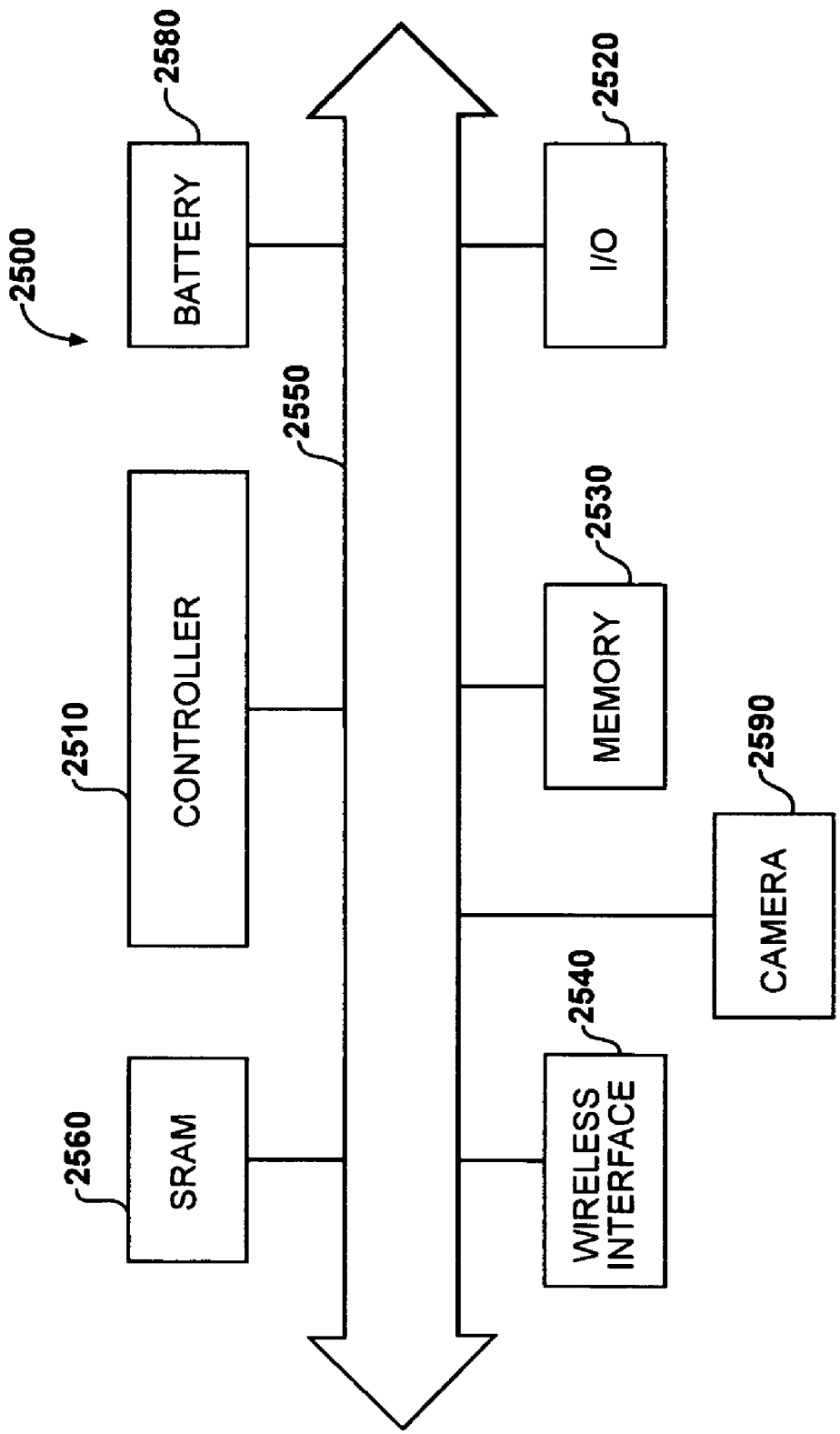
FIG. 12 shows a block diagram of an electronic device comprising memory, a controller, a wireless interface, a camera, SRAM, I/O and a battery.

Turning to FIG. 12, a portion of a system 2500 in accordance with an embodiment of the present invention is described. System 2500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 2500 may be used in any of the following systems: a wireless local area network (WLAN) system, a wireless personal area network (WPAN) system, or a cellular network, although the scope of the present invention is not limited in this respect.

System 2500 may include a controller 2510, an input/output (I/O) device 2520 (e.g. a keypad, display), a memory 2530, a wireless interface 2540, and a static random access memory (SRAM) 2560 and coupled to each other via a bus 2550. A battery 2580 may supply power to the system 2500 in one embodiment. It should be noted that the scope of the present invention is not limited to embodiments having any or all of these components (e.g. circuit elements).

Controller 2510 may comprise, for example, one or more microprocessors, digital signal processors, micro-controllers, or the like. Memory 2530 may be used to store messages transmitted to or by system 2500. Memory 2530 may also optionally be used to store instructions that are executed by controller 2510 during the operation of system 2500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 2530 may be provided by one or more different types of memory.

The I/O device 2520 may be used to generate a message. The system 2500 may use the wireless interface 2540 to transmit and receive messages to and from a wireless communication network with a radio frequency (RF) signal. Examples of the wireless interface 2540 may include an antenna, or a wireless transceiver, such as a dipole antenna, although the scope of the present invention is not limited in this respect. Also, the I/O device 2520 may deliver a voltage reflecting what is stored as either a digital output (if digital information was stored), or it may be analog information (if analog information was stored). One or more of the elements of System 2500 may beneficially incorporate the embodiments herein described to optimize interconnect and use of gates or other logic functions therein. For example, the processor may utilize programmable connections comprising a phase-change material to connect a portion of the logic contained therein, or used in the chips to implement the processor.

Additionally, the system 2500 may include at least a first and a second conductive line, wherein each conductive line may be coupled to one or more circuit elements. The first conductive line may be programmable coupled to the second conductive line through a phase-change programmable connection.

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

I claim:

1. A method of operating an apparatus, said apparatus comprising a programmable interconnect matrix array, said array comprising a plurality of first conductive lines, a plurality of second conductive lines, and a plurality of programmable connections, each of said programmable connections comprising a phase-change material and having a closed connection state, an intermediate resistance connection state, and an open connection state, each of said programmable connections being electrically coupled between one of said first conductive lines and one of said second conductive lines, said electrical coupling occurring without an active selection device in series with the phase-change material between said lines, said method comprising the step of:

applying energy to a first of said programmable connections, said energy transforming said first programmable connection to a first connection state between a first of said first conductive lines and a first of said second conductive lines, said first connection state being a first closed connection or a first intermediate resistance connection; and applying energy to a second of said programmable connections, said energy transforming said second programmable connection to a second connection state between a second of said first conductive lines and a second of said second conductive lines, said second connection state being a second closed connection or a second intermediate resistance connection; said second connection state coexisting with said first connection state in said array.

2. The method of claim 1 further comprising configuring the first conductive lines as outputs from logic.

3. The method of claim 1 further comprising configuring the second conductive lines as inputs to logic.

4. The method of claim 1, further comprising applying energy to a third of said programmable connections, said energy transforming said third programmable connection to a third connection state between a third of said first conductive lines and a third of said second conductive lines, said third connection state being a third closed connection or a third intermediate resistance connection; said third connection state coexisting with said first connection state and said second connection state in said array.

5. The method of claim 1, wherein said first connection state is said first closed connection.

6. The method of claim 5, wherein said second connection state is said second closed connection.

7. The method of claim 1, wherein said apparatus further comprises first circuitry connected to said first of said first conductive lines, said method further comprising transmitting a first signal from said first circuitry through said first closed connection.

8. The method of claim 7, wherein said first circuitry comprises a controller.

9. The method of claim 7, wherein said first circuitry is analog circuitry.

10. The method of claim 7, wherein said first circuitry does not program or read said first closed connection.

11. The method of claim 7, wherein said second circuitry does not program or read said first closed connection.

12. The method of claim 7, wherein said first circuitry comprises a first logic device.

13. The method of claim 12, wherein said apparatus further comprises second circuitry connected to said first of said second conductive lines, said method further comprising transmitting said first signal to said second circuitry.

14. The method of claim 13, wherein said second circuitry comprises a controller.

15. The method of claim 13, wherein said second circuitry comprises a second logic device.

16. The method of claim 13, wherein said second circuitry is analog circuitry.

17. The method of claim 7, wherein said apparatus further comprises second circuitry connected to said second of said first conductive lines, said method further comprising transmitting a second signal from said second circuitry through said second closed connection.

18. The method of claim 17, wherein said first circuitry comprises a first controller and said second circuitry comprises a second controller.

19. The method of claim 17, wherein said first circuitry comprises a first logic device.

20. The method of claim 19, wherein said second circuitry comprises a second logic device.

21. The method of claim 20, wherein said apparatus further comprises third circuitry connected to said second of said first conductive lines, said method further comprising transmitting said first signal to said third circuitry.

22. The method of claim 21, wherein said third circuitry comprises a third logic device.

23. The method of claim 21, wherein said apparatus further comprises fourth circuitry connected to said second of said second conductive lines, said method further comprising transmitting said second signal to said fourth circuitry.

24. The method of claim 23, wherein said third circuitry comprises a third logic device and said fourth circuitry comprises a fourth logic device.

25. An apparatus, comprising:

a first set of conductive lines;

a second set of conductive lines;

a plurality of programmable elements coupled between said first conductive lines and said second conductive lines, said programmable elements each comprising a phase-change material and lacking an active device in series with said phase-change material, said programmable elements having a closed connection state, an intermediate resistance connection state, and an open connection state, said programmable elements providing a first connection state between a first of said first conductive lines and a first of said second conductive lines and a second connection state between a second of said first conductive lines and a second of said second conductive lines, said first connection state being a first closed connection or a first intermediate resistance connection and said second connection state being a second closed connection or a second intermediate resistance connection.

26. The apparatus of claim 25, wherein said programmable connections further comprise a breakdown layer.

27. The apparatus of claim 25, wherein said first connection state is said first closed connection.

28. The apparatus of claim 27, wherein said second connection state is said second closed connection.

29. The apparatus of claim 25, further comprising first circuitry connected to said first of said first conductive lines and second circuitry connected to said first of said second conductive lines.

30. The apparatus of claim 29, wherein said first circuitry comprises a first controller.

31. The apparatus of claim 30, wherein said first controller comprises a microprocessor, microcontroller, or digital signal processor.

32. The apparatus of claim 30, wherein said second circuitry comprises a logic device or logic array.

33. The apparatus of claim 30, wherein said second circuitry comprises a second controller.

34. The apparatus of claim 29, wherein said first circuitry comprises a first logic device.

35. The apparatus of claim 34, wherein said second circuitry comprises a second logic device.

36. The apparatus of claim 29, wherein said first circuitry is analog circuitry.

37. The apparatus of claim 36, wherein said second circuitry is analog circuitry.

38. The apparatus of claim 29, further comprising third circuitry connected to said second of said first conductive lines and fourth circuitry connected to said second of said second conductive lines.

39. The apparatus of claim 38, wherein said first circuitry comprises a first controller and said third circuitry comprises a second controller.

40. The apparatus of claim 38, wherein said first circuitry comprises a first logic device and said third circuitry comprises a second logic device.

41. The apparatus of claim 40, wherein said third circuitry comprises a third logic device and said fourth circuitry comprises a fourth logic device.

* * * * *